United States Patent
Park et al.

(10) Patent No.: US 11,329,070 B2
(45) Date of Patent: May 10, 2022

(54) ELECTRONIC PANEL AND ELECTRONIC DEVICE INCLUDING SAME

(71) Applicant: SAMSUNG DISPLAY CO., LTD., Yongin-si (KR)

(72) Inventors: Hyungjun Park, Seongnam-si (KR); Wonkyu Kwak, Seongnamsi (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 119 days.

(21) Appl. No.: 16/783,791

(22) Filed: Feb. 6, 2020

(65) Prior Publication Data
US 2020/0258913 A1 Aug. 13, 2020

(30) Foreign Application Priority Data
Feb. 7, 2019 (KR) .......................... 10-2019-0014485

(51) Int. Cl.
*H01L 27/12* (2006.01)
*G06F 3/041* (2006.01)

(52) U.S. Cl.
CPC .......... *H01L 27/124* (2013.01); *G06F 3/0412* (2013.01)

(58) Field of Classification Search
CPC ........... H01L 27/124; H01L 2251/5338; H01L 51/0097; H01L 27/3223; H01L 27/3276; H01L 51/5253; H01L 27/3234; H01L 27/323; H01L 27/3244; G06F 3/0412; G06F 3/0443; G06F 3/0446; G06F 2203/04103; G06F 3/041; Y02E 10/549
See application file for complete search history.

(56) References Cited

U.S. PATENT DOCUMENTS

| | | | |
|---|---|---|---|
| 7,830,591 B2 | 11/2010 | Shimodaira | |
| 10,152,147 B2 | 12/2018 | Choi et al. | |
| 2016/0306472 A1* | 10/2016 | Park | ................... H01L 51/5256 |
| 2017/0287992 A1 | 10/2017 | Kwak et al. | |
| 2018/0069191 A1 | 3/2018 | Lee et al. | |
| 2018/0095567 A1* | 4/2018 | Lee | ........................ G06F 3/044 |
| 2018/0138450 A1 | 5/2018 | Park et al. | |
| 2018/0182818 A1* | 6/2018 | Kim | ..................... H01L 27/322 |
| 2018/0183015 A1 | 6/2018 | Yun et al. | |
| 2018/0226454 A1 | 8/2018 | Liu et al. | |

FOREIGN PATENT DOCUMENTS

| | | |
|---|---|---|
| EP | 3276463 | 1/2018 |
| KR | 10-1493556 | 2/2015 |
| KR | 10-2017-0111827 | 10/2017 |

* cited by examiner

*Primary Examiner* — Kyoung Lee
(74) *Attorney, Agent, or Firm* — F. Chau & Associates, LLC

(57) ABSTRACT

Provided is an electronic panel. The electronic panel includes a display unit including a plurality of pixels, an encapsulation layer covering the pixels, and a planarization layer disposed on the encapsulation layer, the display unit in a plan view including an active area displaying an image and a peripheral area adjacent to the active area, and an input sensing unit disposed on the display unit and configured to detect an external input. An upper surface of the encapsulation layer includes a flat surface provided in the active area and a non-flat surface provided in the peripheral area and curved compared to the flat surface. The planarization layer covers the non-flat surface. The input sensing unit is disposed on the flat surface and on the non-flat surface.

22 Claims, 20 Drawing Sheets

ELECTRONIC PANEL AND ELECTRONIC DEVICE INCLUDING SAME

CROSS-REFERENCE TO RELATED APPLICATIONS

This U.S. non-provisional patent application claims priority under 35 U.S.C. § 119 to Korean Patent Application No. 10-2019-0014485, filed on Feb. 7, 2019, in the Korean Intellectual Property Office, the entire contents of which are herein incorporated by reference.

TECHNICAL FIELD

The present inventive concept relates to an electronic panel and an electronic device including the same, and more particularly, to an electronic panel including reliable display unit and input sensing unit and an electronic device including the same.

DISCUSSION OF RELATED ART

An electronic device, which is activated in response to an electrical signal, may include subdevices composed of various electronic components, such as a display unit for displaying an image, or an input sensing unit for detecting an external input. The electronic components may be electrically interconnected by variously arranged signal lines.

The display unit includes a light emitting element for generating an image. The input sensing unit may include sensing electrodes for detecting an external input. When the display unit and the input sensing unit are included in different panels, the electronic device may have an increased thickness and an increased process cost. On the other hand, when the display unit and the input sensing unit are integrated in a single base substrate, interferences between various electronic components in the display unit and/or the input sensing unit may occur.

SUMMARY

The present inventive concept is to provide an electronic device and a method of manufacturing the same, which may enhance the integration degree of a display unit and an input sensing unit and enhance the reliability.

An exemplary embodiment of the present inventive concept provides an electronic panel including: a display unit including a plurality of pixels, an encapsulation layer covering the pixels, and a planarization layer disposed on the encapsulation layer, the display unit in a plan view including an active area displaying an image and a peripheral area adjacent to the active area; and an input sensing unit disposed on the display unit and configured to detect an external input, in which an upper surface of the encapsulation layer includes: a flat surface provided in the active area; and a non-flat surface provided in the peripheral area and curved compared to the flat surface, in which the planarization layer covers the non-flat surface, and the input sensing unit is disposed on the flat surface and on the non-flat surface.

In an exemplary embodiment of the present inventive concept, an upper surface of the planarization layer may be parallel to the flat surface.

In an exemplary embodiment of the present inventive concept, at least a part of the planarization layer may cover the flat surface.

In an exemplary embodiment of the present inventive concept, the planarization layer may cover the flat surface entirely.

In an exemplary embodiment of the present inventive concept, an upper surface of the planarization layer may define a plane substantially the same as that of the flat surface.

In an exemplary embodiment of the present inventive concept, the encapsulation layer may include a first inorganic layer, a second inorganic layer disposed on the first inorganic layer, and an organic layer disposed between the first inorganic layer and the second inorganic layer, in which the non-flat surface may non-overlap the organic layer in the plan view.

In an exemplary embodiment of the present inventive concept, the display unit may further include a dam part disposed in the peripheral area and non-overlapping the organic layer in the plan view, in which the planarization layer may be disposed overlapping the dam part in the plan view.

In an exemplary embodiment of the present inventive concept, the input sensing unit may include a plurality of sensing electrodes disposed in the active area and a plurality of detection lines connected to the sensing electrodes, in which the detection lines may be disposed on the planarization layer and may be disposed overlapping the non-flat surface in the plan view.

In an exemplary embodiment of the present inventive concept, an electronic device includes: an electronic panel configured to display an image and detect an external input; and an electronic module overlapping the electronic panel in a plan view, in which the electronic panel includes: a base substrate including an active area and a peripheral area adjacent to the active area; a plurality of pixels disposed on the base substrate and configured to display the image in the active area; an encapsulation layer including an upper surface that includes a flat surface defined in the active area and overlapping the pixels in the plan view and a first non-flat surface defined in the peripheral area and curved compared to the flat surface; a planarization layer disposed on the first non-flat surface; and an input sensing unit disposed on the encapsulation layer and the planarization layer and including a plurality of sensing electrodes and a plurality of detection lines connected to the sensing electrodes.

In an exemplary embodiment of the present inventive concept, a hole area may be defined in an area overlapping the electronic module in the active area, in which at least some of the pixels may be removed in the hole area.

In an exemplary embodiment of the present inventive concept, at least some of the sensing electrodes may be removed from the hole area.

In an exemplary embodiment of the present inventive concept, the encapsulation layer may further include a second non-flat surface overlapping the hole area, in which the electronic panel may further include a hole planarization layer disposed on the second non-flat surface overlapping the hole area.

In an exemplary embodiment of the present inventive concept, each of the sensing electrodes may include a plurality of detection patterns and a plurality of connection patterns each disposed between the detection patterns and connecting two adjacent ones of the detection patterns, in which at least some of the detection patterns and the connection patterns may be disposed on the hole planarization layer to overlap the second non-flat surface overlapping the hole area in the plan view.

In an exemplary embodiment of the present inventive concept, the electronic panel may further include a panel hole defined in the hole area and passing through the electronic panel, in which the electronic module may be disposed overlapping the panel hole.

In an exemplary embodiment of the present inventive concept, a connection pattern disposed in the hole area among the connection patterns may extend along an edge of the panel hole.

In an exemplary embodiment of the present inventive concept, the electronic panel may further include a dam part disposed in the peripheral area, in which the planarization layer may overlap the dam part in the plan view.

In an exemplary embodiment of the present inventive concept, some of the detection lines may be disposed on the planarization layer to overlap the dam part in the plan view.

In an exemplary embodiment of the present inventive concept, the planarization layer may cover at least a portion of the flat surface.

In an exemplary embodiment of the present inventive concept, the planarization layer may be disposed on the flat surface to overlap the active area.

In an exemplary embodiment of the present inventive concept, an upper surface of the planarization layer may define a plan substantially the same as that of the flat surface.

In an exemplary embodiment of the present inventive concept, an upper surface of the planarization layer may define a plane parallel to the flat surface.

In an exemplary embodiment of the present inventive concept, an electronic panel includes: a display unit including an active area displaying an image and a peripheral area adjacent to the active area; an encapsulation layer formed in the display unit, and including a first flat surface provided in the active area and extending to a portion of the peripheral area, and a non-flat surface provided in the peripheral area; a planarization layer disposed on the non-flat surface of the encapsulation layer and providing a second flat surface; and an input sensing unit disposed on the first flat surface and the second flat surface, and configured to detect an external input, in which the input sensing unit may include a plurality of sensing electrodes disposed in the active area, and a plurality of detection lines disposed on the second flat surface, connected to the sensing electrodes, and overlapping the non-flat surface of the encapsulation layer in a plan view.

In an exemplary embodiment of the present inventive concept, the input sensing unit may further include a detection insulating layer covering the first flat surface and the second flat surface.

BRIEF DESCRIPTION OF THE FIGURES

The accompanying drawings are included to provide a further understanding of the present inventive concept, and are incorporated in and constitute a part of this specification. The drawings illustrate exemplary embodiments of the present inventive concept and, together with the description, serve to explain principles of the inventive concept, in which.

Figure 1A:
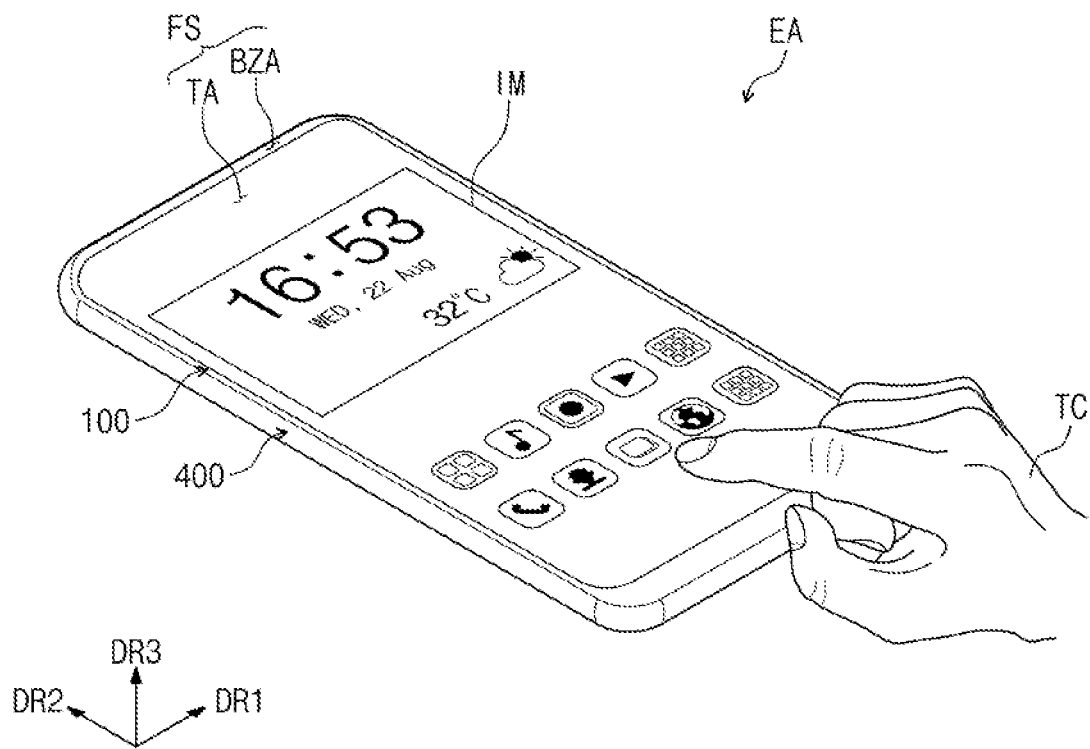
FIG. 1A is an assembled perspective view of an electronic device according to an exemplary embodiment of the present inventive concept.

Since the drawings in FIGS. 1-8 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements.

As used herein, the term "and/or" includes any and all combinations of one or more of the associated listed components.

It will be understood that the terms "first", "second", "third", and the like are used herein to describe various components, but these components should not be limited by these terms. The above terms are used only to distinguish one component from another. For example, a first component may be referred to as a second component and vice versa without departing from the teachings of the present inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing, and it will be understood that these spatially relative terms are intended to encompass different orientations of the device in use or operation, in addition to the orientation illustrated in the drawings.

Unless otherwise defined, all terms (including technical and scientific terms) used herein have the same meaning as terms commonly understood by those skilled in the art to which the present inventive concept belongs. Also, terms such as terms defined in commonly used dictionaries should be interpreted as having meaning consistent with their meaning in the context of the relevant art, and will not be interpreted in an ideal or overly formal sense unless explicitly defined in the present specification.

In various exemplary embodiments of the present inventive concept, the term "include", "comprise", "including" or "comprising" specifies a property, a region, a fixed number, a step, a process, an element and/or a component but does not exclude other properties, regions, fixed numbers, steps, processes, elements and/or components.

Hereinafter, exemplary embodiments of the present inventive concept will be described with reference to the drawings.

Figure 1B:
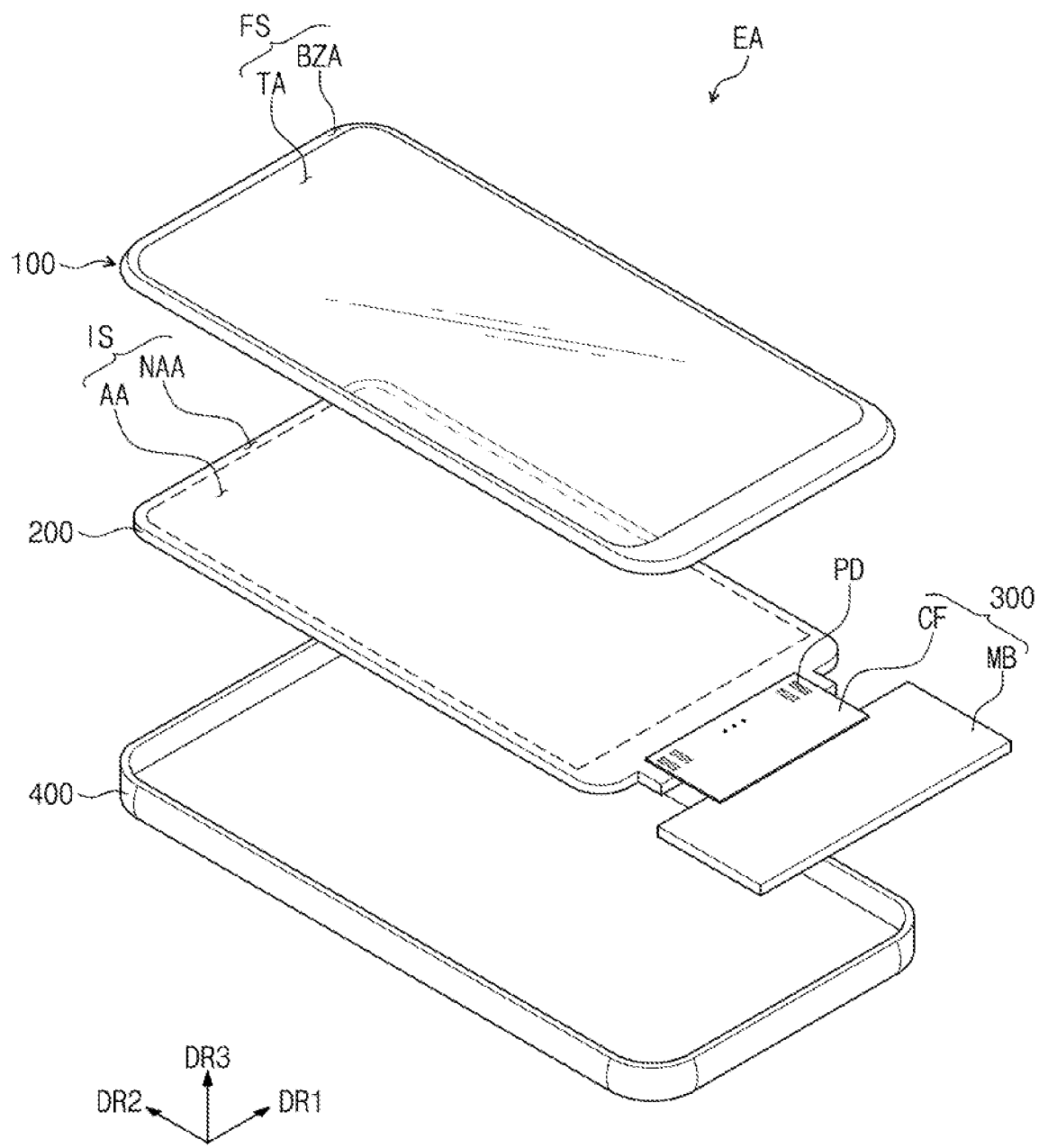
FIG. 1B is an exploded perspective view of an electronic device according to an exemplary embodiment of the present inventive concept.
Figure 2A:
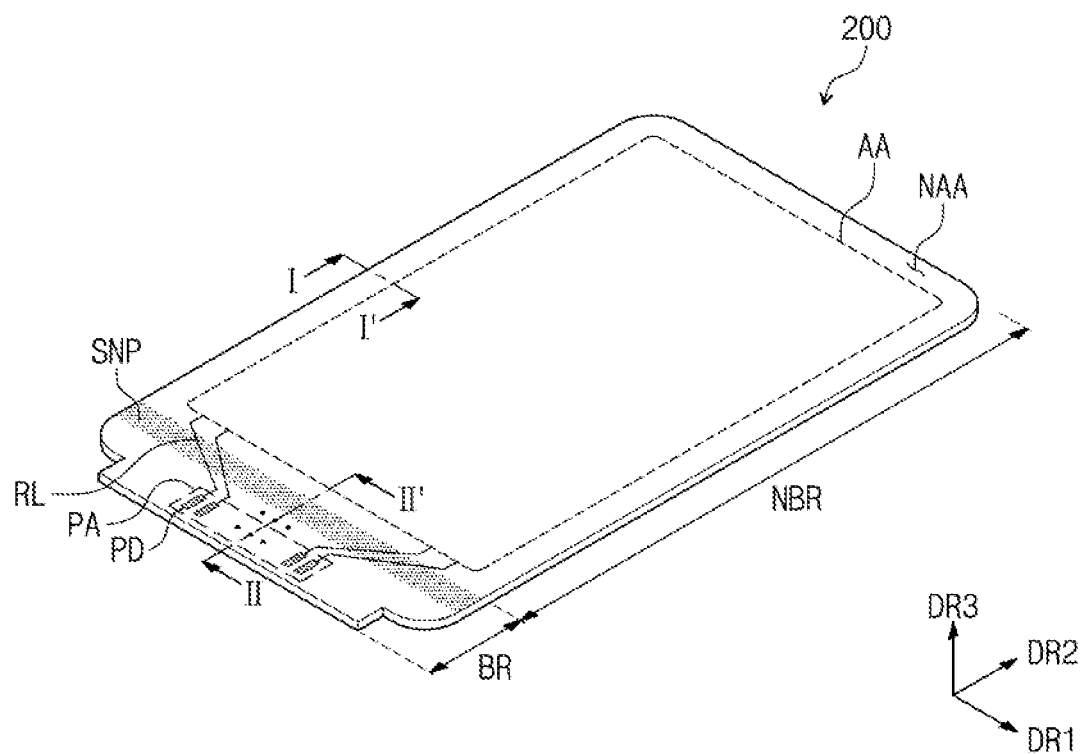
FIGS. 2A and 2B are perspective views of some configurations shown in FIG. 1B.
Figure 2B:
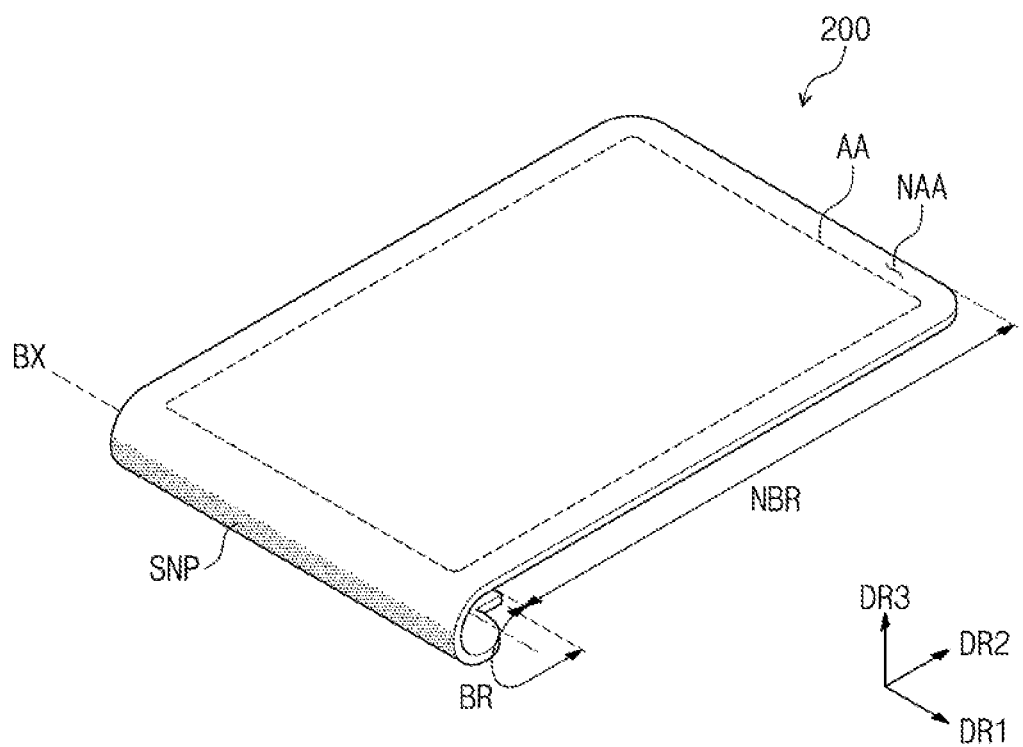
Figure 2C:
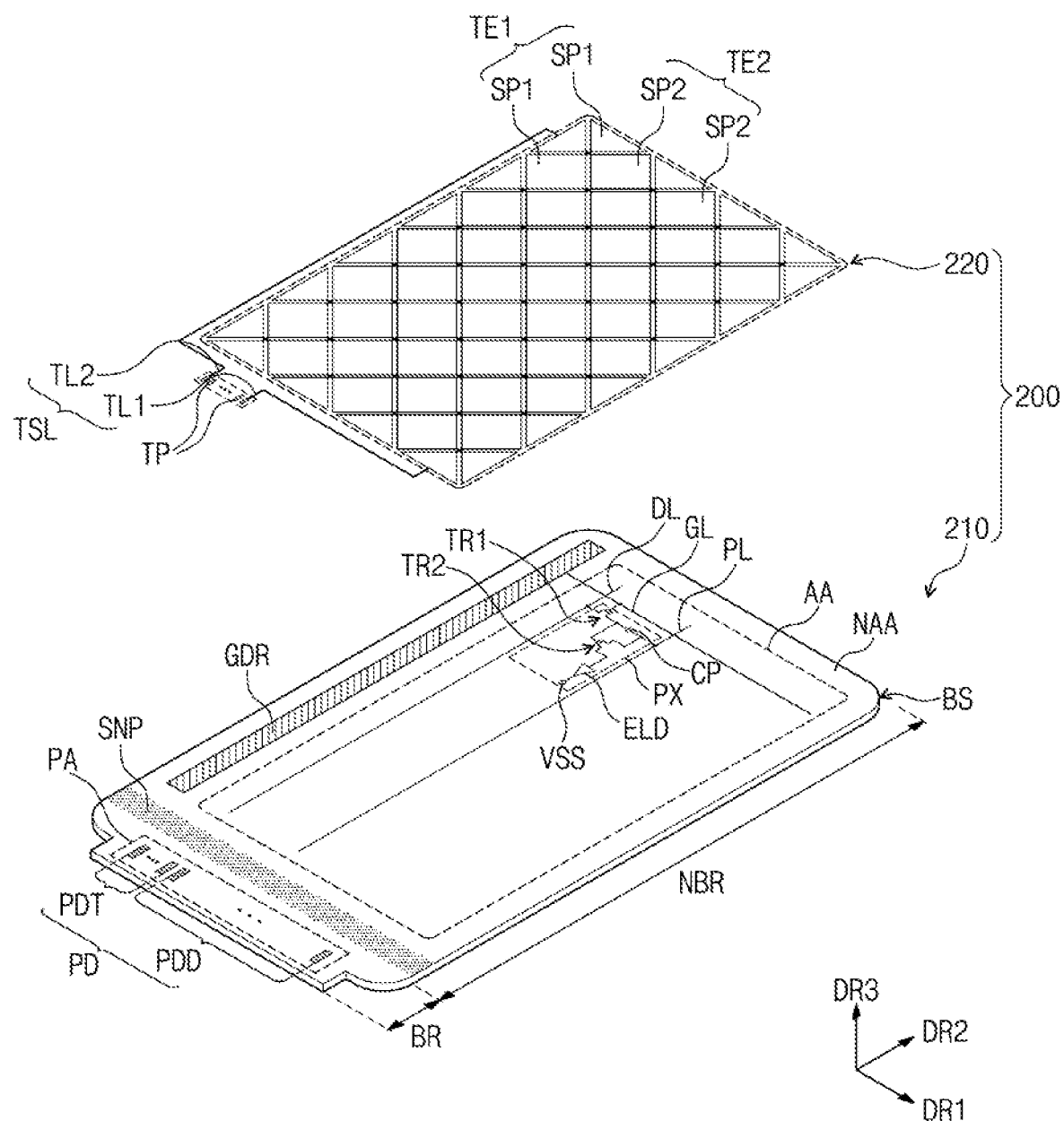
FIG. 2C is an exploded perspective view of an electronic panel according to an exemplary embodiment of the present inventive concept.

FIG. 1A is an assembled perspective view of an electronic device according to an exemplary embodiment of the present inventive concept. FIG. 1B is an exploded perspective view of an electronic device according to an exemplary embodiment of the present inventive concept. FIGS. 2A and 2B are perspective views of some configurations shown in FIG. 1B. FIG. 2C is an exploded perspective view of an electronic panel according to an exemplary embodiment of the present inventive concept. Hereinafter, the present inventive concept will be described with reference to FIGS. 1A to 2C.

As shown in FIG. 1A, the electronic device EA may display the image IM on the front surface FS. The front surface FS may be parallel to a plane defined by the first direction DR1 and the second direction DR2. The front surface FS includes a transmission area TA and a bezel area BZA adjacent to the transmission area TA.

The electronic device EA displays the image IM in the transmission area TA. The image IM may include at least one of a static image and a dynamic image. An internet search window is shown as an example of the image IM in FIG. 1A.

The transmission area TA may have a rectangular shape having short sides parallel to the first direction DR1 and long sides parallel to the second direction DR2, respectively. However, this is illustrated by way of example, and the transmission area TA may have various shapes and is not limited to any one exemplary embodiment. For example, the transmission area TA may be provided in a polygonal shape, a circular shape, an elliptical shape, or a shape corresponding to a portion of these in various exemplary embodiments of the present inventive concept.

The bezel area BZA is adjacent to the transmission area TA, and may surround the transmission area TA. However, this is illustratively shown, and the bezel area BZA may be disposed adjacent to only one side of the transmission area TA, or may be omitted. The electronic device according to an exemplary embodiment of the present inventive concept may include various exemplary embodiments and is not limited to any one exemplary embodiment.

The normal direction of the front surface may correspond to the thickness direction DR3 (hereinafter referred to as a third direction) of the electronic device EA. In the present exemplary embodiment, the front surface (or upper surface) and the rear surface (or lower surface) of each member are defined with reference to the direction in which the image IM is displayed. The front surface and the rear surface are opposed to each other in the third direction DR3.

The directions that the first to third directions DR1, DR2, and DR3 indicate may be converted to other directions as a relative concept. Hereinafter, first to third directions as directions that the respective first to third directions DR1, DR2, and DR3 indicate refer to the same reference numerals.

The electronic device EA according to the present inventive concept may detect an input TC of a user applied from the outside. The user's input TC includes various types of external inputs such as a part of the user's body, light, heat, sound or pressure. In addition, the electronic device EA may detect inputs that contact and also are close to or adjacent to the electronic device EA.

In the present exemplary embodiment, the user's input TC is shown with the user's hand applied to the front surface FS. But, this is illustrated by way of example, and as described above, the user's input TC may be provided in various forms, and also, the electronic device EA may detect a user's input TC applied to the side surface or rear surface of the electronic device EA according to the structure of the electronic device EA and is not limited to any one exemplary embodiment.

As shown in FIG. 1B, the electronic device EA may include a window 100, an electronic panel 200, a circuit substrate 300, and an external case 400. The window 100 and the external case 400 are combined to define the appearance of the electronic device EA. For example, the electronic panel 200 and the circuit substrate 300 may be enclosed by the window 100 and the external case 400. In an exemplary embodiment of the present inventive concept, the window 100 couples with the external case 400 to fix in place the electronic panel 200 and the circuit substrate 300.

The window 100 is disposed on the electronic panel 200 to cover the front surface IS of the electronic panel 200, and may include an optically transparent insulating material. For example, the window 100 may include glass or plastic. The window 100 may have a multi-layer or single-layer structure. For example, the window 100 may have a laminated structure of a plurality of plastic films bonded with an adhesive, or may have a laminated structure of a glass substrate and a plastic film bonded with an adhesive. In the case of a flexible display device, a plastic film that has excellent ductility may be used to form the window 100.

The window 100 includes a front surface FS exposed to the outside. The front surface FS of the electronic device EA may be substantially defined by the front surface FS of the window.

The transmission area TA may be an optically transparent area, and may have a shape corresponding to the active area AA. For example, the transmission area TA overlaps the entire surface or at least part of the active area AA. The image IM displayed on the active area AA of the electronic panel 200 may be viewed from the outside through the transmission area TA.

The bezel area BZA may be an area with a lower light transmittance compared to the transmission area TA. The bezel area BZA defines the shape of the transmission area TA. The bezel area BZA is adjacent to the transmission area TA and may surround the transmission area TA.

The bezel area BZA may have a predetermined color. When the window 100 is provided as a glass or plastic substrate, the bezel area BZA may be a color layer printed or deposited on one side of a glass or plastic substrate. Alternatively, the bezel area BZA may be formed by coloring the corresponding area of the glass or plastic substrate.

The bezel area BZA covers the peripheral area NAA of the electronic panel 200 so as to prevent the peripheral area NAA from being visually recognized from the outside. On the other hand, this is illustrated by way of example, and the present inventive concept is not limited thereto. For example, in the window member 100 according to an exemplary embodiment of the present inventive concept, the bezel area BZA may be omitted.

The electronic panel 200 may display the image IM and detect the external input TC. The electronic panel 200 may include an active area AA and a peripheral area NAA that are separated in a plan view. The active area AA may be an area activated according to an electrical signal. In the present exemplary embodiment, the active area AA is an area where the image IM is displayed, and at the same time, an area where the external input TC is detected. However, this is illustratively shown, and the area where the image IM is displayed in the active area AA and the area where the external input TC is detected may be separated from each other, and is not limited to any one exemplary embodiment. Alternatively, the area where the image IM is displayed in the active area AA and the area where the external input TC is detected may partially overlap with each other.

The peripheral area NAA is adjacent to the active area AA. For example, the electronic panel 200 may include the active area AA displaying the image IM, and the peripheral area NAA formed adjacent to the active area AA. The peripheral area NAA may surround the edge of the active area AA. However, this is illustratively shown, and the peripheral area NAA may be adjacent to only a part of the edges of the active area AA and is not limited to any one exemplary embodiment.

In the peripheral area NAA, various signal lines, pads PD, or electronic elements for providing an electrical signal to the active area AA may be disposed. The peripheral area NAA may be covered by the bezel area BZA and not be visible from the outside.

A part of the electronic panel 200 according to an exemplary embodiment of the present inventive concept may be bent. For example, as shown in FIGS. 2A and 2B, the electronic panel 200 may include a non-bending part NBR and a bending part BR. FIG. 2A shows the electronic panel 200 in an unbent state, and FIG. 2B shows the electronic panel 200 in a bent state.

The bending part BR may be bent by an external force based on a bending axis BX extending along the first direction DR1. The bending axis BX may be defined on the rear surface of the electronic panel 200.

On the other hand, the electronic panel 200 may further include a stress relaxation pattern SNP disposed in the bending part BR. The stress relaxation pattern SNP may be disposed between the active area AA and the pad area PA where the pads PD are disposed. The stress relaxation pattern SNP may include organic matter. When the bending part BR is bent, the stress relaxation pattern SNP may prevent damage to the bending part BR due to bending stress.

As the bending part BR is bent so as to surround the bending axis BX, the area of the peripheral area NAA viewed from the front surface FS of the window 100 may be reduced. For example, this would allow some of the peripheral area NAA to be positioned behind the active area AA of the electronic panel 200, thereby reducing or eliminating the peripheral area NAA that needs to be hidden under the masking or the device housing. Thus, the bezel area BZA may be reduced so that the aesthetics of the electronic device EA may be enhanced. However, this is illustratively shown, and the present inventive concept is not limited thereto. For example, in the electronic panel 200 according to an exemplary embodiment of the present inventive concept, the bending part BR may be omitted.

As shown in FIG. 2C, the electronic panel 200 may include a display unit 210 and an input sensing unit 220. In FIG. 2C, the display unit 210 and the input sensing unit 220 are shown separately for ease of explanation.

The display unit 210 may generate and display the image IM in the active area AA. The display unit 210 may include a base substrate BS, a plurality of signal lines GL, DL, PL, and RL, a pixel PX, and a gate driving circuit GDR.

The base substrate BS may correspond to the shape of the electronic panel 200 on the plane. Specifically, the base substrate BS may be substantially configured to provide a bending part BR and a non-bending part NBR. The base substrate BS may be flexible so as to be bendable. For example, the base substrate BS may be an insulating polymer film. The insulating polymer film may include a polymer film material (e.g., polyimide) that has excellent ductility.

The signal lines GL, DL, PL, and RL are disposed on the base substrate BS, and may include a gate line GL, a data line DL, a power supply line PL, and routing wires RL. The gate line GL, the data line DL, and the power supply line PL may each transmit a different electrical signal.

The gate line GL extends along the first direction DR1. Although a plurality of gate lines GL may be provided and arranged to be spaced apart from each other along the second direction DR2, a single gate line GL is exemplarily shown for ease of explanation.

The gate driving circuit GDR provides an electrical signal to the gate line GL, and may be mounted on the base substrate BS. The display unit 210 may further include gate pads for electrically connecting to an externally provided gate driving circuit GDR.

The data lines DL extend along the second direction DR2, and may be electrically insulated from the gate line GL. Although a plurality of data lines DL may be provided and arranged to be spaced apart from each other along the first direction DR1, a single data line DL is exemplarily shown for ease of explanation. The data line DL provides a data signal to the pixel PX.

The power supply line PL extends along the second direction DR2, and may be electrically insulated from the gate line GL and the data line DL. Although a plurality of power supply lines PL may be provided and arranged to be spaced apart from each other along the first direction DR1, a single power line PL is exemplarily shown for ease of explanation. The power supply line PL may provide a power signal (hereinafter referred to as a first power signal) to the pixel PX.

The routing wires RL are disposed in the peripheral area NAA, and may be disposed to overlap a stress relaxation pattern SNP in a plan view. The routing wires RL connect the pads PD and the signal lines corresponding to the pads PD, respectively. The signal lines may include lines connected to the data line DL, the gate line GL, and the gate driving circuit GDR, and a line connected to the power supply line PL. On the other hand, this is illustratively shown, and the routing wires RL may have an integral shape connected to the corresponding signal lines, and are not limited to any one exemplary embodiment.

The pixel PX implements an image IM by displaying light according to an electrical signal. Each pixel PX may display, for example, red, green, blue, or white light. FIG. 2C shows an equivalent circuit diagram of one pixel PX exemplarily.

A plurality of pixels PX may be provided, but a single pixel PX is illustratively shown for ease of explanation. In an exemplary embodiment of the present inventive concept, the plurality of pixels PX may be arranged in a matrix shape, but the present inventive concept is not limited thereto. For example, the plurality of pixels PX may be arranged in a pentile matrix shape, or a diamond shape. Meanwhile, the pixel PX according to the present exemplary embodiment may be implemented by various circuits, and is not limited to any one exemplary embodiment.

The pixel PX may include a first thin film transistor TR1, a second thin film transistor TR2, a capacitor CP, and a light emitting element ELD. The first thin film transistor TR1, the second thin film transistor TR2, the capacitor CP, and the light emitting element ELD are electrically connected.

The first thin film transistor TR1 may be a switching transistor for controlling turn-on and turn-off of the pixel PX. The first thin film transistor TR1 is connected to the gate line GL and the data line DL. The first thin film transistor TR1 is turned on by the gate signal provided through the gate line GL and provides a data signal provided through the data line DL to the capacitor CP.

The capacitor CP is connected to the first thin film transistor TR1 and the first power supply line PL. The capacitor CP stores the amount of voltage corresponding to the difference between the data voltage transmitted from the first thin film transistor TR1 and the first power supply voltage applied to the first power supply line PL.

The second thin film transistor TR2 is connected to the first thin film transistor TR1, the capacitor CP, and the light emitting element ELD. The second thin film transistor TR2 may be a driving transistor for controlling the driving current flowing to the light emitting element ELD in correspondence to the amount of voltage stored in the capacitor CP. The light emitting element ELD may then emit light having predetermined brightness by using the driving current flowing to the light emitting element ELD. The turn-on time of the second thin film transistor TR2 may be determined according to the amount of charge or voltage stored in the capacitor CP. The second thin film transistor TR2 provides to the light emitting element ELD the first power supply voltage transmitted through the first power supply line PL during the turn-on time.

The light emitting element ELD may generate light or control the amount of light according to an electrical signal. For example, the light emitting element ELD may include an organic light emitting element, a quantum dot light emitting element, an electrophoretic element, or an electrowetting element.

The light emitting element ELD is connected to the second thin film transistor TR2 and the power supply terminal VSS. The light emitting element ELD emits light at a voltage corresponding to the difference between the voltage transmitted through the second thin film transistor TR2 and the second power supply voltage received through the power supply terminal VSS. The light emitting element ELD may emit light during the turn-on time of the second thin film transistor TR2.

The light emitting element ELD includes a light emitting material, and may generate light of a color corresponding to the light emitting material. The color of light generated in the light emitting element LED may be any one of red, green, blue, and white.

This is illustrated by way of example, and the pixel PX may include electronic elements having various configurations and arrangements, and is not limited to any one exemplary embodiment. The display unit 210 may produce a predetermined image through light emitted from the pixels PX.

The gate driving circuit GDR is disposed in the peripheral area NAA, and generates gate driving signals. The gate line GL is connected to the gate driving circuit GDR to transmit a gate driving signal to the pixel PX. Meanwhile, in the present exemplary embodiment, the gate driving circuit GDR provided may be mounted on the base substrate BS. However, this is illustratively shown, and the present inventive is not limited thereto. For example, the gate driving circuit GDR according to an exemplary embodiment of the present inventive concept may be provided in the form of a chip or may be mounted on a separate circuit substrate and attached to the base substrate BS.

The pads PD may be provided in the display unit 210, and may include display pads PDD and detection pads PDT.

The display pads PDD provide electrical signals to the display unit 210.

Specifically, the display pads PDD provide the electrical signals to the pixel PX and the gate driving circuit GDR through various signal lines. For example, the display pads PDD may include a pad connected to the data line DL, a pad connected to the power supply line PL, a pad connected to the gate driving circuit GDR, and a pad connected to the second power supply terminal VSS.

The detection pads PDT may provide electrical signals to the input sensing unit 220. For example, the detection pads PDT may be connected to the terminal pads TP of the input sensing unit 220, respectively. Detailed description for this will be made later.

According to the present inventive concept, by providing the display pads PDD and the detection pads PDT in one pad area PA, the display unit 210 and the input sensing unit 220 may be simultaneously driven through one circuit substrate 300 (see FIG. 1B) so that the assemblability may be facilitated and the process may be simplified. However, this is illustratively described, and the present inventive is not limited thereto. For example, in the electronic panel 200 according to an exemplary embodiment of the present inventive concept, the detection pads PDT may be provided in the input sensing unit 220 and may be provided in a space separate from the display pads PDD.

The input sensing unit 220 may be disposed on the display unit 210, and may be configured to detect the external input TC and obtain the position or intensity information of the external input TC. The input sensing unit 220 may include a plurality of sensing electrodes TE1 and TE2, a plurality of detection lines TL1 and TL2, and a plurality of detection pads PDT.

The sensing electrodes TE1 and TE2 are disposed in the active area AA. The sensing electrodes TE1 and TE2 may include a first sensing electrode TE1 and a second sensing electrode TE2 that receive different electrical signals from each other. The input sensing unit 220 may obtain information on the external input TC through a change in capacitance between the first sensing electrode TE1 and the second sensing electrode TE2.

The first sensing electrode TE1 extends along the second direction DR2, and may be provided in plurality and arranged apart from each other along the first direction DR1. The first sensing electrode TE1 may include a plurality of first detection patterns SP1 arranged along the second direction DR2 and electrically connected to each other. Two first detection patterns SP1 respectively arranged at two opposite ends of the first sensing electrode TE1 among the first detection patterns SP1 may have a size, for example, a half size, smaller than a size of the first detection patterns SP1 arranged at the center.

The second sensing electrode TE2 extends along the first direction DR1, and may be provided in plurality and arranged apart from each other along the first direction DR1. The second sensing electrode TE2 may include a plurality of second detection patterns SP2 arranged along the first direction DR1 and electrically connected to each other. Two second detection patterns SP2 respectively arranged at two opposite ends of the second sensing electrode TE2 among the second detection patterns SP2 may have a size, for example, a half size, smaller than a size of the second detection patterns SP2 arranged at the center.

The detection lines TL1 and TL2 and the terminal pads TP are disposed in the peripheral area NAA. The terminal pads TP are connected to the detection lines TL1 and TL2, respectively. The terminal pads TP are electrically connected to the detection pads PDT of the pads PD.

The detection lines TL1 and TL2 include a first detection line TL1 and a second detection line TL2. The first detection line TL1 connects the terminal pad TP corresponding to the first sensing electrode TE1 among the terminal pads TP and the first detection pattern SP1 to deliver to the first sensing electrode TE1 an electrical signal externally provided through the detection pad PDT. The second detection line TL2 connects the terminal pad TP corresponding to the second sensing electrode TE2 among the terminal pads TP and the second detection pattern SP2 to deliver to the second sensing electrode TE2 an electrical signal externally provided through the detection pad PDT.

Referring again to FIG. 1B, the circuit substrate 300 may be connected to the electronic panel 200. The circuit substrate 300 may include a flexible substrate CF and a main substrate MB. The flexible substrate CF may include an insulating film and conductive wires mounted on the insulating film. The conductive wires are connected to the pads PD to electrically connect the circuit substrate 300 and the electronic panel 200. Meanwhile, in the present exemplary embodiment, the flexible substrate CF may be omitted, and the main substrate MB may be directly connected to the electronic panel 200 at this time.

The main substrate MB may include signal lines and electronic elements. The electronic elements may be connected to the signal lines and electrically connected to the electronic panel 200. The electronic elements generate various electrical signals, for example, a signal for generating the image IM or a signal for detecting an external input TC, or process detected signals. On the other hand, the main substrate MB may be provided in plurality for generating each of the signals and processing each of the detected signals and is not limited to any one exemplary embodiment.

The external case 400 is disposed on the lower side of the electronic panel 200, and may include a material having a relatively higher rigidity than the electronic panel 200. For example, the external case 400 may include a plurality of frames and/or plates made of, for example, glass, plastic, metal, or a combination thereof.

The external case 400 provides a predetermined accommodation space. The electronic panel 200 and the circuit substrate 300 may be accommodated in the accommodation space and protected from external impacts. According to the present inventive concept, an electronic device EA having a usage environment capable of displaying an image IM with one electronic panel 200 and simultaneously detecting an external input TC may be provided. For example, the display unit 210 and the input sensing unit 220 are integrated in a single base substrate within one electronic panel 200. Thus, the thickness of the electronic device EA may be reduced, and the electronic device EA with enhanced assemblability may be provided.

Figure 3A:
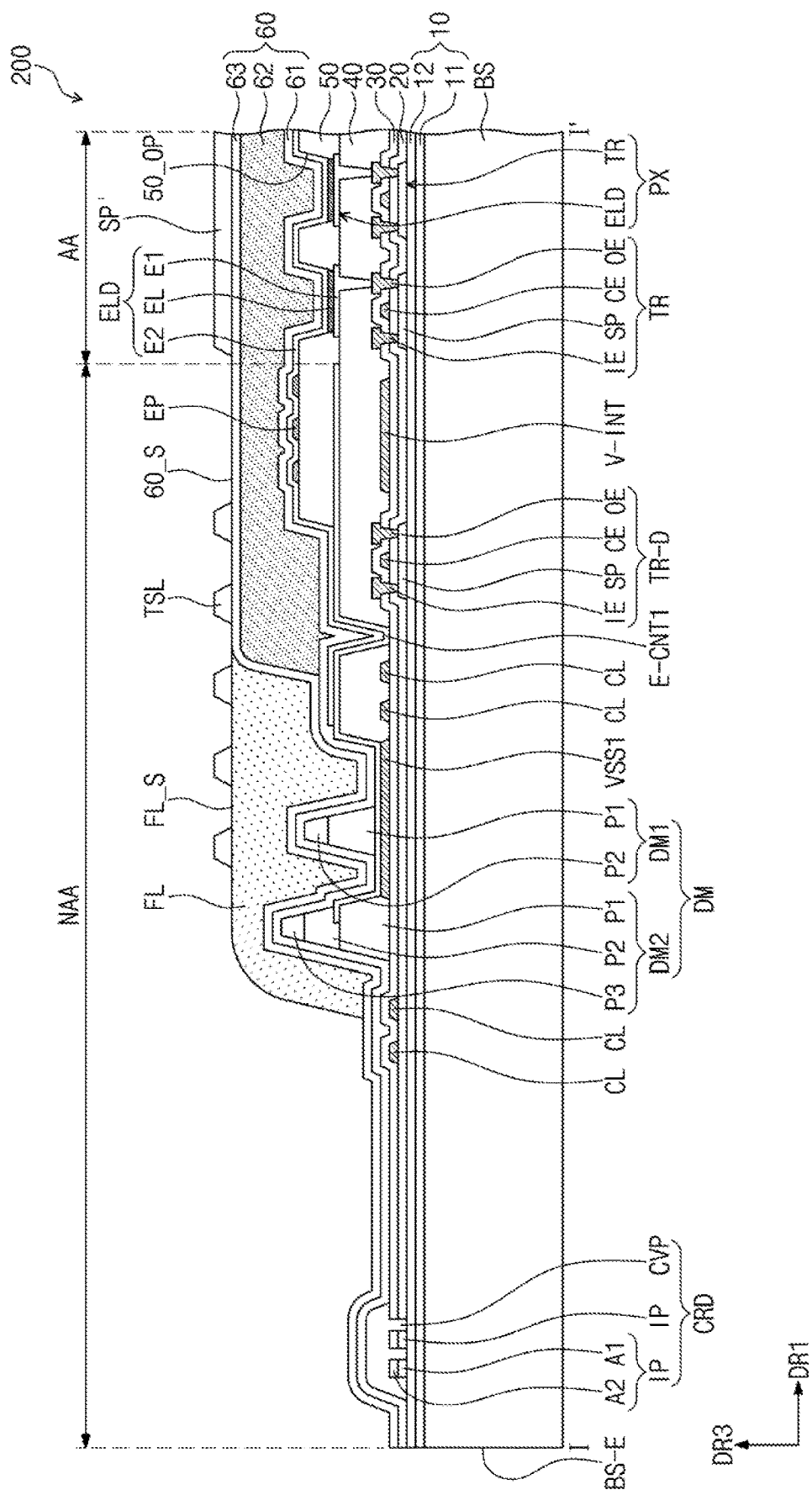
FIG. 3A is a cross-sectional view taken along line I-I' shown in FIG. 2A.
Figure 3B:
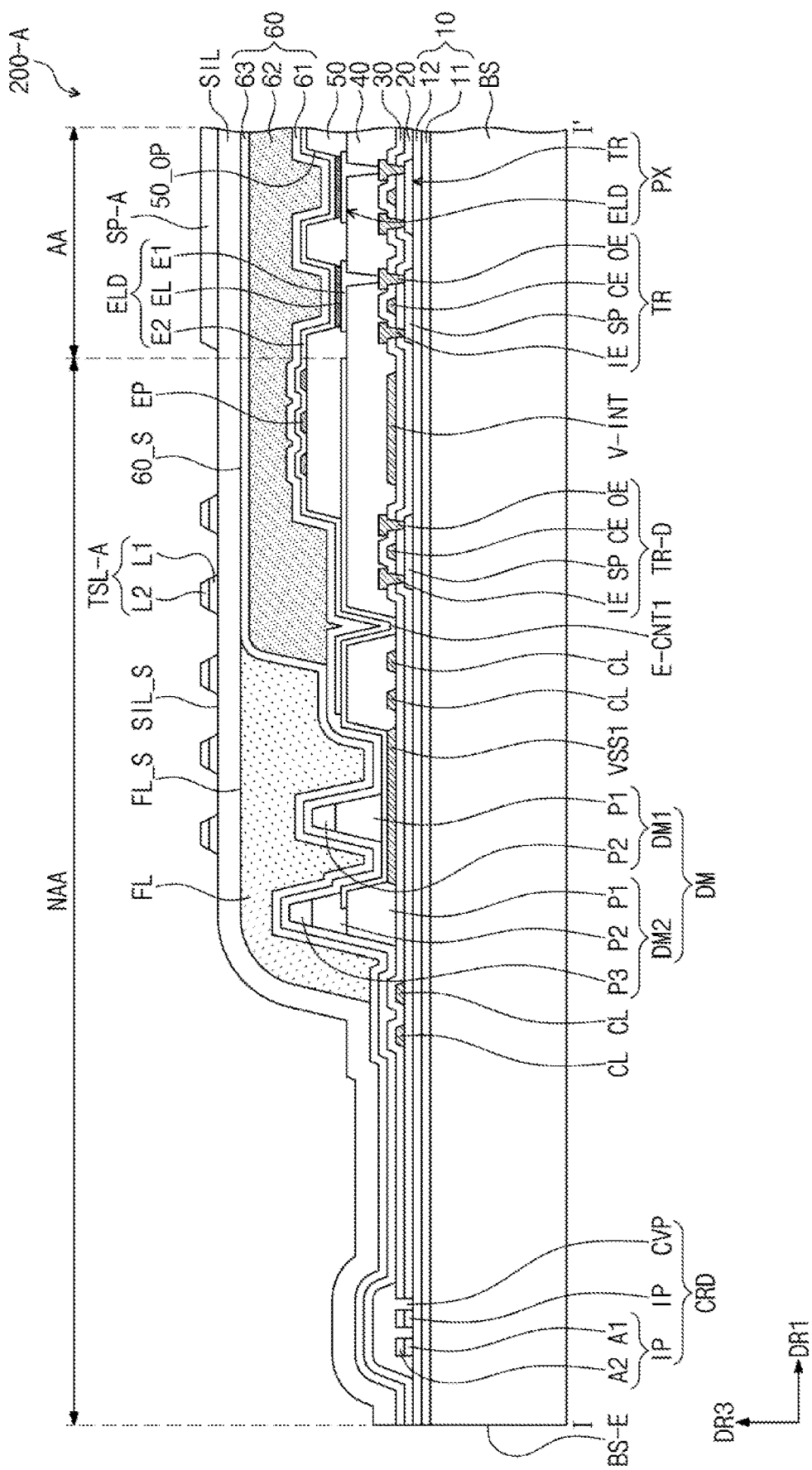
FIGS. 3B and 3C are cross-sectional views of electronic panels according to an exemplary embodiment of the present inventive concept, and show areas corresponding to FIG. 3A for ease of explanation.
Figure 3C:
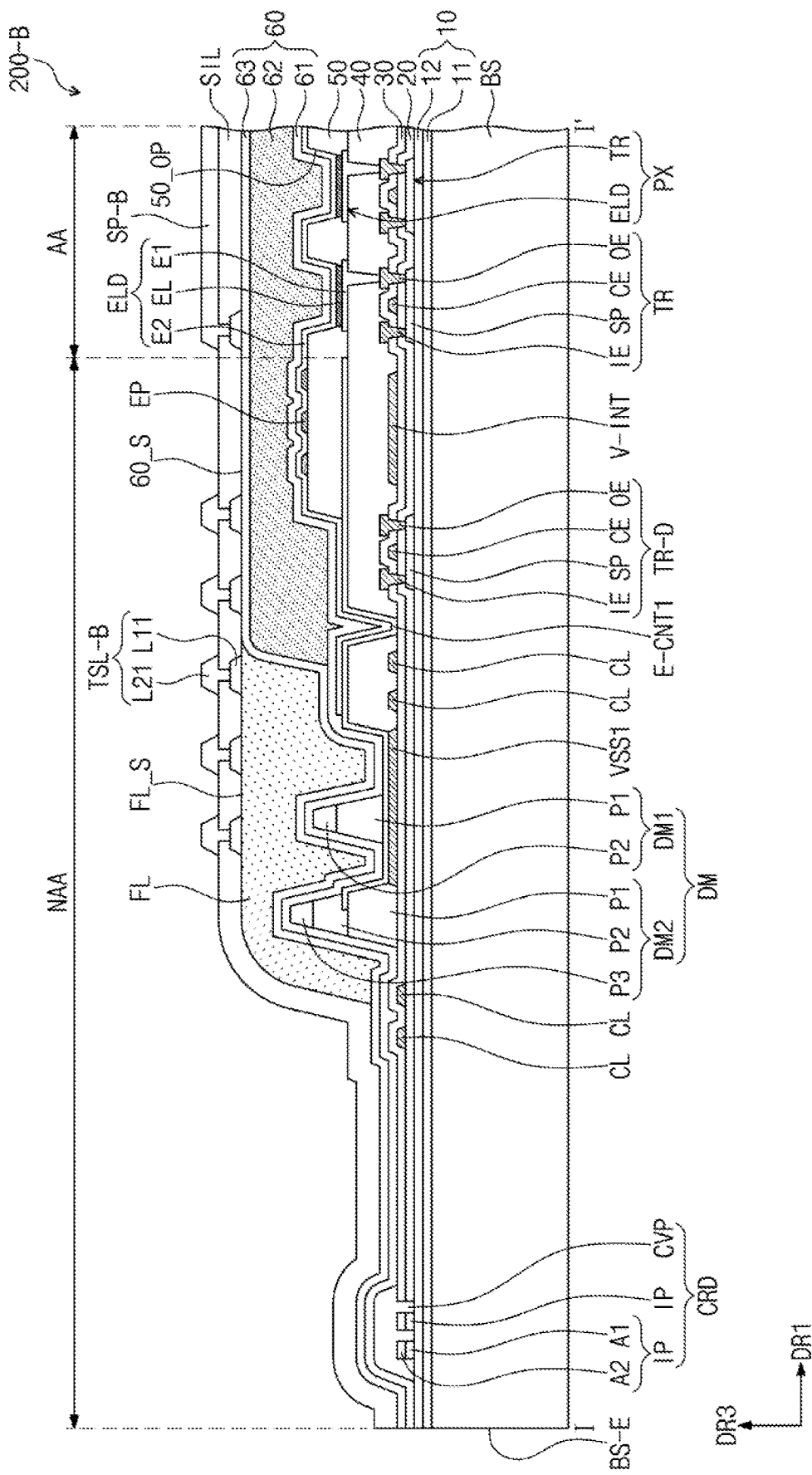

FIG. 3A is a cross-sectional view taken along line I-I' shown in FIG. 2A. FIGS. 3B and 3C are cross-sectional views of electronic panels according to an exemplary embodiment of the present inventive concept, and show areas corresponding to FIG. 3A for ease of explanation. Hereinafter, the present inventive concept will be described with reference to FIGS. 3A to 3C.

As shown in FIG. 3A, the electronic panel 200 includes a base substrate BS, a pixel PX, a plurality of insulating layers 10, 20, 30, 40, 50, and 60, and detection lines and detection patterns TSL and SP'. In FIG. 3A, the second thin film transistor TR (hereinafter referred to as a pixel transistor) and the light emitting element ELD of the configuration of the pixel PX are illustratively shown for ease of explanation.

The base substrate BS may include an insulating material. For example, the base substrate BS may include a polyimide (PI). Thus, as shown in FIG. 2B, at least a part of the electronic panel 200 may be easily bent. However, this is exemplarily described, and the base substrate BS may be provided in a rigid state. For example, the base substrate BS may be formed of various materials such as, for example, glass, plastic and a combination thereof, and is not limited to any one exemplary embodiment.

The first insulating layer 10 is disposed on the base substrate BS. The first insulating layer 10 covers the front surface of the base substrate BS, and may include a barrier layer 11 and a buffer layer 12.

The barrier layer 11 may include an inorganic material, and may prevent oxygen or water flowing through the base substrate BS from penetrating the pixel PX. The buffer layer 12 may include an inorganic material such as, for example, silicon oxide ($SiO_2$), silicon nitride ($Si_3N_4$), and/or silicon oxynitride (SiON). The buffer layer 12 may provide a surface energy to the pixel PX lower than that provided by the base substrate BS, so that the pixel PX is stably formed on the base substrate BS.

In FIG. 3A, barrier layer 11 and buffer layer 12 are each shown as a single layer for ease of explanation. However, this is illustratively shown, and the barrier layer 11 and the buffer layer 12 according to an exemplary embodiment of the present inventive concept may be provided in plurality and may be stacked alternately with each other. Alternatively, at least one of the barrier layer 11 and the buffer layer 12 may be provided in plurality or may be omitted.

The pixel transistor TR includes a semiconductor pattern SP, a control electrode CE, an input electrode IE, and an output electrode OE. The semiconductor pattern SP is disposed on the base substrate BS, and may include a semiconductor material such as, for example, polycrystalline silicon. The control electrode CE is spaced apart from the semiconductor pattern SP with the second insulating layer 20 interposed therebetween. The control electrode CE may be connected to the first thin film transistor TR1 and one electrode of the capacitor CP. The control electrode CE here may correspond to a gate electrode of the pixel transistor TR.

The input electrode IE and the output electrode OE are spaced apart from the control electrode CE with the third insulating layer 30 disposed therebetween. The input electrode IE and the output electrode OE of the pixel transistor TR pass through the second insulating layer 20 and the third insulating layer 30 and are electrically connected to one side and the other side of the semiconductor pattern SP, respectively. For example, the input electrode IE and the output electrode OE of the pixel transistor TR may correspond to a source electrode and a drain electrode of the pixel transistor TR.

The fourth insulating layer 40 is disposed on the third insulating layer 30 to cover the input electrode IE and the output electrode OE. The fourth insulating layer 40 may include an organic material and/or an inorganic material, and may have a single layer or a laminated structure.

In the pixel transistor TR, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on a layer the same as that of the semiconductor pattern SP and directly connected to the semiconductor pattern SP. The pixel transistor TR according to an exemplary embodiment of the present inventive concept may be formed in various structures, and is not limited to any one exemplary embodiment.

The light emitting element ELD is disposed on the fourth insulating layer 40. The light emitting element ELD includes a first electrode E1, a light emitting layer EL, and a second electrode E2. The first electrode E1 may be connected to the pixel transistor TR through the fourth insulating layer 40. Moreover, the electronic panel 200 may further include a separate connection electrode disposed between the first electrode E1 and the pixel transistor TR, and at this time, the first electrode E1 may be electrically connected to the pixel transistor TR through the connection electrode.

The fifth insulating layer 50 is disposed on the fourth insulating layer 40. An opening part 50_OP may be defined in the fifth insulating layer 50. The opening part 50_OP exposes at least a part of the first electrode E1. The fifth insulating layer 50 may include an organic material such as, for example, polyimide. In the present exemplary embodiment, the fifth insulating layer 50 may be a pixel defining film.

The light emitting layer EL is disposed in the opening part 50_OP and disposed on the first electrode E1 exposed by the opening part 50_OP. The light emitting layer EL may include a light emitting material. For example, the light emitting layer EL may include at least one of materials emitting red, green, or blue light, and may include a fluorescent material or a phosphorescent material. The light emitting layer EL may include an organic light emitting material or an inorganic light emitting material. For example, in an exemplary embodiment of the present inventive concept, the display unit 210 of the electronic panel 200 may include an organic light-emitting display unit or a quantum dot light-emitting display unit. A light emitting layer EL of the organic light-emitting display unit may include an organic light-emitting material. A light emitting layer EL of the quantum dot light-emitting display unit may include a quantum dot and a quantum rod. The light emitting layer EL may emit light in response to a potential difference between the first electrode E1 and the second electrode E2.

The second electrode E2 is disposed on the light emitting layer EL, and may be opposed to the first electrode E1. The second electrode E2 may have an integral shape extending from the active area AA to the peripheral area NAA, and may be provided commonly to a plurality of pixels. Each light emitting element ELD disposed in each of the pixels receives a common second power supply voltage through the second electrode E2.

The second electrode E2 may include a transparent conductive material or a semi-transparent conductive material. In an exemplary embodiment of the present inventive concept, the second electrode E2 may include a transparent conductive oxide, and the transparent conductive oxide may include but are not limited to: indium tin oxide (ITO), indium zinc oxide (IZO), zinc oxide (ZnO), indium oxide ($In_2O_3$), etc. Accordingly, light generated in the light emitting layer EL may be easily emitted toward the third direction DR3 through the second electrode E2. But, this is illustrated by way of example. Depending on the design, the light emitting element ELD according to an exemplary embodiment of the present inventive concept may be driven in the rear surface light-emission system in which the first electrode E1 includes a transparent or semi-transparent material, or may be driven in a double-sided light-emission system in which light is emitted towards both front and rear surfaces, but is not limited to any one exemplary embodiment.

The sixth insulating layer 60 is disposed on the light emitting element ELD to seal the light emitting element ELD. In the present exemplary embodiment, the sixth insulating layer 60 may be an encapsulation layer. The sixth insulating layer 60 may have an integral shape extending from the active area AA to the peripheral area NAA. The sixth insulating layer 60 may be provided commonly to a plurality of pixels PX. For example, the display unit 210 may include the plurality of pixels PX, and the encapsulation layer (the six insulating layer 60) may be provided to cover the plurality of pixels PX. A capping layer covering the second electrode E2 may be further disposed between the second electrode E2 and the sixth insulating layer 60.

The sixth insulating layer 60 may include a first inorganic layer 61, an organic layer 62, and a second inorganic layer 63 that are sequentially stacked along a third direction DR3. In the present exemplary embodiment, each of the first inorganic layer 61, the organic layer 62, and the second inorganic layer 63 is shown as a single layer. However, this is illustratively shown, and at least one of the first inorganic layer 61, the organic layer 62, and the second inorganic layer 63 may be provided in plurality or may be omitted, but is not limited to any one exemplary embodiment.

The first inorganic layer 61 may cover the second electrode E2. The first inorganic layer 61 may prevent external moisture or oxygen from penetrating the light emitting element ELD. For example, the first inorganic layer 61 may include silicon nitride ($Si_3N_4$), silicon oxide ($SiO_2$), or a combination thereof. The first inorganic layer 61 may be formed through a deposition process.

The organic layer 62 may be disposed on the first inorganic layer 61 and contact the first inorganic layer 61. The organic layer 62 may provide a flat surface on the first inorganic layer 61. Specifically, the organic layer 62 may provide a flat surface to the active area AA.

The curve formed on the upper surface of the first inorganic layer 61 and the particles existing on the first inorganic layer 61 are covered by the organic layer 62, such that this may prevent the influence of the surface state of the upper surface of the first inorganic layer 61 on the structures formed on the organic layer 62. Further, the organic layer 62 may relieve the stress between the contacting layers. The organic layer 62 may include an organic material, and may be formed through a solution process such as, for example, a spin coating process, a slit coating process, or an inkjet process. In an exemplary embodiment of the present inventive concept, the organic material of the organic layer 62 may include, for example, an imide-based polymer, a general-purpose polymer such as polymethylmethacrylate (PMMA) and polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof.

The second inorganic layer 63 is disposed on the organic layer 62 to cover the organic layer 62. The second inorganic layer 63 may be stably formed on a relatively flat surface than that disposed on the first inorganic layer 61. The second inorganic layer 63 seals moisture or the like emitted from the organic layer 62 to prevent it from being introduced into the outside. The second inorganic layer 63 may include silicon nitride ($Si_3N_4$), silicon oxide ($SiO_2$), or a combination thereof. The second inorganic layer 63 may be formed through a deposition process.

The planarization layer FL is disposed on the sixth insulating layer 60 (the encapsulation layer) to cover at least a part of the upper surface of the sixth insulating layer 60. The upper surface of the sixth insulating layer 60 may include a flat surface 60_S having a plane the same as that provided on the active area AA and a curved non-flat surface compared to the flat surface 60_S. The non-flat surface may be an area where substantially no organic layer 62 is provided, and may be an area where the dam parts DM1 and DM2 are disposed. For example, the non-flat surface may non-overlap the organic layer 62 in a plan view, and may be an area only including the first inorganic layer 61 and the second inorganic layer 63.

The planarization layer FL may be disposed in the peripheral area NAA to cover a non-flat surface in the upper surface of the sixth insulating layer 60. The planarization layer FL provides a flat surface FL_S on the upper side. The planarization layer FL includes an organic matter. In an exemplary embodiment of the present inventive concept, the organic matter of the planarization layer FL may include, for example, an imide-based polymer, a general-purpose polymer such as polymethylmethacrylate (PMMA) and polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. In the present exemplary embodiment, the flat surface FL_S defined by the planarization layer FL is shown as defining a plane substantially the same as that of the flat surface 60_S defined by the sixth insulating layer 60. However, this is illustratively shown, when the flat surface FL_S defined by the planarization layer FL has a plane substantially parallel to that of the flat surface 60_S defined by the sixth insulating layer 60, the height of the flat surface FL_S defined by the planarization layer FL may be variously designed and is not limited to any one exemplary embodiment. In the present exemplary embodiment, as shown in FIG. 3A, the electronic panel 200 includes the planarization layer FL which covers the non-flat surface of the display unit 210 (e.g. the non-flat surface of the sixth insulating layer 60), thus the detection line TSL of the input sensing unit 220 can be disposed on the planarization layer FL. Accordingly, area where the input sensing unit 220 can be disposed can be expanded to the non-flat surface of the display unit 210 (e.g. the non-flat surface of the sixth insulating layer 60). Thus, the electronic panel 200 may have better electrical reliability and the input sensing unit 220 may have better process reliability.

FIG. 3B illustrates the detection line TSL and detection pattern SP' of the input sensing unit 220 as an example. The detection pattern SP' is disposed in the active area AA. The detection pattern SP' may be any one of a first detection pattern SP1 and a second detection pattern SP2.

The detection pattern SP' includes a conductive material. On the other hand, the detection pattern SP' may be optically transparent. Accordingly, even if the detection pattern SP' overlaps with the light emitting layer EL disposed in the opening part 50_OP in a plan view, it is possible to prevent the problem that the light generated from the light emitting layer EL is not visually recognized due to the detection pattern SP'.

This is illustratively shown, and the detection pattern SP' may include a plurality of mesh lines. At this time, the detection pattern SP' may be disposed so as not to overlap with the opening part 50_PP. The detection pattern SP' according to an exemplary embodiment of the present inventive concept may be designed with various materials and various shapes and is not limited to any one exemplary embodiment. For example, when the detection pattern SP' includes a plurality of mesh lines, the detection pattern SP' may include a transparent or non-transparent conductive material.

The detection line TSL is disposed in the peripheral area NAA. The detection line TSL may be a part of the first detection lines TL1. In the present exemplary embodiment, the detection line TSL may include a material the same as that of the detection pattern SP'. For example, the detection line TSL may include a transparent material or may include a plurality of mesh lines. For example, the detection line TSL having the plurality of mesh lines may include one of, for example, silver (Ag), molybdenum (Mo), aluminum (Al), copper (Cu), chromium (Cr), nickel (Ni), and titanium (Ti), but the present disclosure is not limited thereto. The transparent conductive material may include a transparent conductive oxide such as, for example, indium tin oxide (ITO), indium zinc oxide (IZO), zinc oxide (ZnO), and indium tin zinc oxide (ITZO). However, this is exemplarily described, and the detection line TSL may include a material different from that of the detection pattern SP' and may be disposed on a different layer, and is not limited to any one exemplary embodiment.

Some of the detection lines TSL may be disposed on the planarization layer FL. For example, some of the detection lines TSL may be disposed on the planarization layer FL to overlap the dam parts DM1 and DM2 in a plan view. The upper surface FL_S of the planarization layer FL may define a plane substantially the same as that of the upper surface 60_S of the sixth insulating layer 60. According to the present inventive concept, the electronic panel 200 further includes a planarization layer FL, so that the area where the detection line TSL is disposed may extend to the outside of the upper surface 60_S of the sixth insulating layer 60. Specifically, the planarization layer FL covers an area for providing a non-flat surface unlike the active area AA of the upper surface 60_S of the sixth insulating layer 60 to provide a flat surface FL_S. As the detection line TSL is disposed on the planarization layer FL, it may also be formed on the upper surface of the sixth insulating layer 60 providing a non-flat surface. For example, the input sensing unit 220 may include the plurality of sensing electrodes TE1 and TE2 disposed in the active area AA, and the plurality of detection lines TSL (e.g., TL1, TL2, and TL3 as shown in FIG. 7C) may be connected to the plurality of sensing electrodes TE1 and TE2, in which the detection lines TSL may be disposed on the planarization layer FL and may overlap the non-flat surface of the encapsulation layer (the sixth insulating layer 60) in a plan view.

According to the present inventive concept, the area of the peripheral area NAA for providing the detection line TSL may be reduced, and the area of the active area AA may be prevented from being reduced. In addition, as the area where the detection line TSL is disposed becomes wide, the interval between the detection lines TSL may be stably secured and the electrical interference between the detection lines TSL may be reduced. Thus, the electrical reliability of the electronic panel 200 may be enhanced.

According to the present inventive concept, as the detection lines TSL and the detection pattern SP' are disposed on the flat surface, the detection lines TSL and the detection pattern SP' may be stably formed on the display unit 210. Accordingly, the process reliability of the input sensing unit 220 may be enhanced.

According to the present inventive concept, the electronic panel 200 may further include a thin film transistor TR-D (hereinafter referred to as a driving transistor), a plurality of signal patterns VSS1, E-CNT1, V-INT, and CL, and a plurality of dam parts DM1 and DM2, which are disposed in the peripheral area NAA. The driving transistor TR-D, the signal patterns VSS1, E-CNT1, V-INT, and CL, and the dam parts DM1 and DM2 constitute the display unit 210 (see FIG. 2C). On the other hand, the gate driving circuit GDR (see FIG. 2C) may be configured by the driving transistor TR-D and some of the signal patterns VSS1, E-CNT1, V-INT, and CL.

The driving transistor TR-D is illustratively shown as having a structure corresponding to the pixel transistor TR. For example, the driving transistor TR-D may include a semiconductor pattern SP disposed on the first insulating layer 10, a control electrode CE disposed on the second insulating layer 20, and an input electrode IE and an output electrode OE disposed on the third insulating layer 30.

The pixel transistor TR and the driving transistor TR-D may be formed simultaneously in the same process, thereby simplifying the process and reducing the process cost. However, this is illustratively shown, and the driving transistor TR-D according to an exemplary embodiment of the present inventive concept includes electrodes and a semiconductor pattern arranged on a layer different from that of the pixel transistor TR, or has a structure different from that of the pixel transistor TR and is not limited to any one exemplary embodiment.

The signal patterns VSS1, E-CNT1, V-INT, and CL include a power supply line VSS1, a connection electrode E-CNT1, an initialization voltage line V-INT and a driving signal line CL. The power supply line VSS1 may correspond to the power supply terminal VSS of the pixel PX. The power supply line VSS1 supplies a second power supply voltage to the light emitting element ELD.

The power supply line VSS1 is disposed on the third insulating layer 30. The power supply line VSS1 is disposed on a layer the same as that of the input electrode IE or the output electrode OE of the driving transistor TR-D. The power supply line VSS1 may be simultaneously patterned with one mask in a process the same as that of the input electrode IE or the output electrode OE of the driving transistor TR-D. However, this is illustrated by way of example, and the power supply line VSS1 may be disposed on a layer different from that of the input electrode IE or the output electrode OE of the driving transistor TR-D and may be formed through a separate process, and is not limited to any one exemplary embodiment.

The connection electrode E-CNT1 is disposed on the fourth insulating layer 40, and is electrically connected to the power supply line VSS1. The connection electrode E-CNT1 covers the power supply line VSS1 exposed from the fourth insulating layer 40.

The second electrode E2 of the light emitting element ELD extends from the active area AA and is connected to the connection electrode E-CNT1. For example, the second electrode E2 may be arranged on an entire surface of the active area AA, and may be formed as one body to cover a plurality of pixels. The second electrode E2 may extend to a portion of the peripheral area NAA to connect to the connection electrode E-CNT1. The connection electrode E-CNT1 may receive a second power supply voltage from the power supply line VSS1. Accordingly, the second power supply voltage is transmitted to the second electrode E2 through the connection electrode E-CNT1 so that a common second power supply voltage may be provided to each pixel.

The connection electrode E-CNT1 may be disposed on a layer the same as that of the first electrode E1 of the light emitting element ELD and may be formed simultaneously with the first electrode E1. However, this is illustratively shown, and the connection electrode E-CNT1 may be disposed on a layer different from that of the first electrode E1.

The driving signal lines CL may be provided in plurality and disposed on the third insulating layer 30. The driving signal lines CL may be disposed in the peripheral area NAA. The driving signal line CL may be a routing wire connected to a pad, or may be a wire constituting an integrated circuit IC. The driving signal lines CL are disposed to be spaced apart from each other in the first direction DR1 and independently transmit electrical signals.

The initialization voltage line V-INT provides an initialization voltage to the pixel PX, and may be provided in plurality to provide an initialization voltage to each of the plurality of pixels.

The driving signal lines CL and the initialization voltage line V-INT may be disposed on the same layer and formed simultaneously through the same process. However, this is merely exemplary and the driving signal lines CL and the initialization voltage line V-INT may be independently formed through separate processes and are not limited to any one exemplary embodiment.

The dam parts DM1 and DM2 are disposed in the peripheral area NAA. The dam parts DM1 and DM2 may prevent the organic layer 62 from flowing out from the active area AA toward the outside of the dam parts DM1 and DM2, for example, toward the opposite direction of the first direction DR1 indicated by the arrow in FIG. 3A.

The dam parts DM1 and DM2 may be disposed adjacent to at least one side of the active area AA. The dam parts DM1 and DM2 may surround the active area AA in a plan view. The dam parts DM1 and DM2 may be provided in plurality and may include a first dam part DM1 and a second dam part DM2.

The first dam part DM1 may be disposed closer to the active area AA compared to the second dam part DM2, and may be disposed to overlap the power supply line VSS1 in a plan view. In the present exemplary embodiment, the connection electrode E-CNT1 may cross over between the first dam part DM1 and the power supply line VSS1 on the cross section.

In the present exemplary embodiment, the first dam part DM1 includes a material the same as that of the fourth insulating layer 40, and may be formed simultaneously with the fourth insulating layer 40 through one mask. Accordingly, a separate process for forming the first dam part DM1 may be omitted, so that the process cost may be reduced and the process may be simplified.

The second dam part DM2 may be disposed relatively outward compared to the first dam part DM1. The second dam part DM2 may be disposed at a position for covering a part of the power supply line VSS1. In the present exemplary embodiment, the second dam part DM2 may have a multi-layer structure including a first layer P1, a second layer P2, and a third layer P3. Although it is shown in FIGS. 3A-3C that the first dam part DM1 has a double-layered structure and the second dam part DM2 has a triple-layered structure, the present inventive concept is not limited thereto. For example, in an exemplary embodiment of the present inventive concept, the first dam part DM1 and the second dam part DM2 may have a single-layered structure or a triple or more layered structure.

In the present exemplary embodiment, the connection electrode E-CNT may be partially overlapped with and disposed on the first layer P1 of the second dam part DM2. The end of the connection electrode E-CNT1 may be inserted between the first layer P1 and the second layer P2 of the second dam part DM2. However, this is illustratively shown, and the connection electrode E-CNT may not extend to the second dam part DM2, and is not limited to any one exemplary embodiment.

The electronic panel 200 according to an exemplary embodiment of the present inventive concept may further include a crack dam CRD. The crack dam CRD may be disposed in the peripheral area NAA and disposed adjacent to the side surface of the base substrate BS. FIG. 3A shows one side surface BS-E of a plurality of side surfaces of the base substrate BS and the crack dam CRD adjacent to the side surface BS-E for ease of explanation.

The crack dam CRD may extend along the extending direction of the side surface BS-E of the adjacent base substrate BS. The crack dam CRD in FIG. 3A is shown with a bar shape extending along the second direction DR2 (see FIG. 2B) that intersects the first direction DR1. The crack dam CRD may prevent damage of cracks or the like propagated from the side surface BS-E of the base substrate BS from progressing to the active area AA, thereby enhancing the reliability of the electronic panel 200.

The crack dam CRD may include a plurality of insulating patterns IP and a cover pattern CVP. Each of the insulation patterns IP may extend along the second direction DR2 and be arranged apart from each other along the first direction DR1. The insulation patterns IP cut off the path of impact or crack propagated in the first direction DR1. Thus, the reliability of the electronic panel 200 may be enhanced.

Each of the insulating patterns IP may have a laminated structure including a first layer A1 and a second layer A2. The first layer A1 may be disposed on a layer the same as that of the second insulating layer 20 and formed simultaneously with the second insulating layer 20. The second layer A2 may be disposed on a layer the same as that of the third insulating layer 30 and may be formed simultaneously with the third insulating layer 30. Accordingly, the insulating patterns IP may be formed at the same time when the electronic panel 200 is formed without adding additional processes so that the process may be simplified and the process cost may be reduced. On the other hand, this is illustratively shown, and each of the insulating patterns IP may include a layer formed simultaneously with the first insulating layer 10, and is not limited to any one exemplary embodiment.

The cover pattern CVP covers the insulating patterns IP, and may fill the separation spaces between the insulating patterns IP. The cover pattern CVP may include a material that is relatively soft compared to the insulating patterns IP. For example, the cover pattern CVP may include an organic or conductive material. Thus, it is possible to easily prevent damage such as cracks generated in the insulating patterns IP from progressing to the active area AA. On the other hand, this is illustratively shown, and the present inventive concept is not limited thereto. For example, in the electronic panel 200 according to an exemplary embodiment of the present inventive concept, a plurality of crack dams CRD may be provided or omitted.

According to the present inventive concept, the planarization layer FL covers a non-flat surface in the peripheral area NAA. The non-flat surface may exist in the area where the dam part DM, the crack dam CRD, and the various driving elements TR-D, VSS1, E-CNT1, V-INT, and CL are formed. The planarization layer FL is disposed on the dam part DM, the crack dam CRD, and the various driving elements TR-D, VSS1, E-CNT1, V-INT, and CL to provide a flat surface FL_S to the upper side. Accordingly, the input sensing unit 220 including the detection line TSL may be stably disposed on the dam part DM, the crack dam CRD, and the various driving elements TR-D, VSS1, E-CNT1, V-INT, and CL. For example, the planarization layer FL may cover the non-flat surface of the sixth insulating layer 60 (the encapsulation layer), and the input sensing unit 220 may be disposed on the flat surface 60_S and on the non-flat surface of the sixth insulating layer 60 (the encapsulation layer). For example, the input sensing unit 220 may be disposed on the flat surface 60_S of the sixth insulating layer 60 (the encapsulation layer) and the flat surface FL_S of the planarization layer which is disposed on the non-flat surface of the sixth insulating layer 60 (the encapsulation layer). Therefore, the area of the input sensing unit 220 disposed on the display unit 210 may be easily secured, so that the electrical reliability of the electronic panel 200 may be enhanced.

As shown in FIG. 3B, in the electronic panel 200-A, the input sensing unit 220 may further include a detection insulating layer SIL. The detection insulating layer SIL covers the upper surfaces 60_S and FL_S of the sixth insulation layer 60 and the planarization layer FL, respectively.

In the electronic panel 200-A, the detection lines TSL-A may have a laminated structure including a plurality of layers. For example, each of the detection lines TSL-A may include a first layer L1 and a second layer L2. The detection lines TSL-A have a laminated structure, so that they may have enhanced transmittance. Thus, the influence that the input sensing unit 220 stacked on the display unit 210 affects the display characteristics of the display unit 210 may be reduced. Alternatively, the detection lines TSL-A may have a laminated structure, so that they may have enhanced conductivity. Thus, the sensitivity of the input sensing unit 220 may be enhanced.

In FIG. 3B, the detection pattern SP-A has a single layer structure unlike the detection lines TSL-A. That is, the detection pattern SP-A and the detection lines TSL-A may be designed independently of each other. However, this is illustratively shown, and as shown in FIG. 3A, the detection lines TSL and the detection pattern SP' may have the same structure and are not limited to any one exemplary embodiment.

As shown in FIG. 3C, in the electronic panel 200-B, each of the detection lines TSL-B includes a first layer L11 and a second layer L21 connected to each other through the detection insulating layer SIL. Thus, the electrical resistance of each of the detection lines TSL-B may be reduced, so that the sensitivity in the electronic panel 200-B may be enhanced. In addition, deformation such as bending of the electronic panel 200-B or defects such as disconnection of the detection lines TSL-B due to external impact may be reduced. Thus, the electrical reliability of the electronic panel 200-B may be enhanced. Each of the first layer L11 and the second layer L21 according to an exemplary embodiment of the present inventive concept may have single-layered structure or a stacked multi-layered structure. The single layered structure may include a metal layer or a transparent conductive layer. The multi-layered structure may include multi-metal layers. The multi-metal layers may have, for example, a three-layered structure of titanium/aluminum/titanium (Ti/Al/Ti). Alternatively, the multi-layered structure may include at least one metal layer and at least one transparent conductive layer.

Figure 4A:
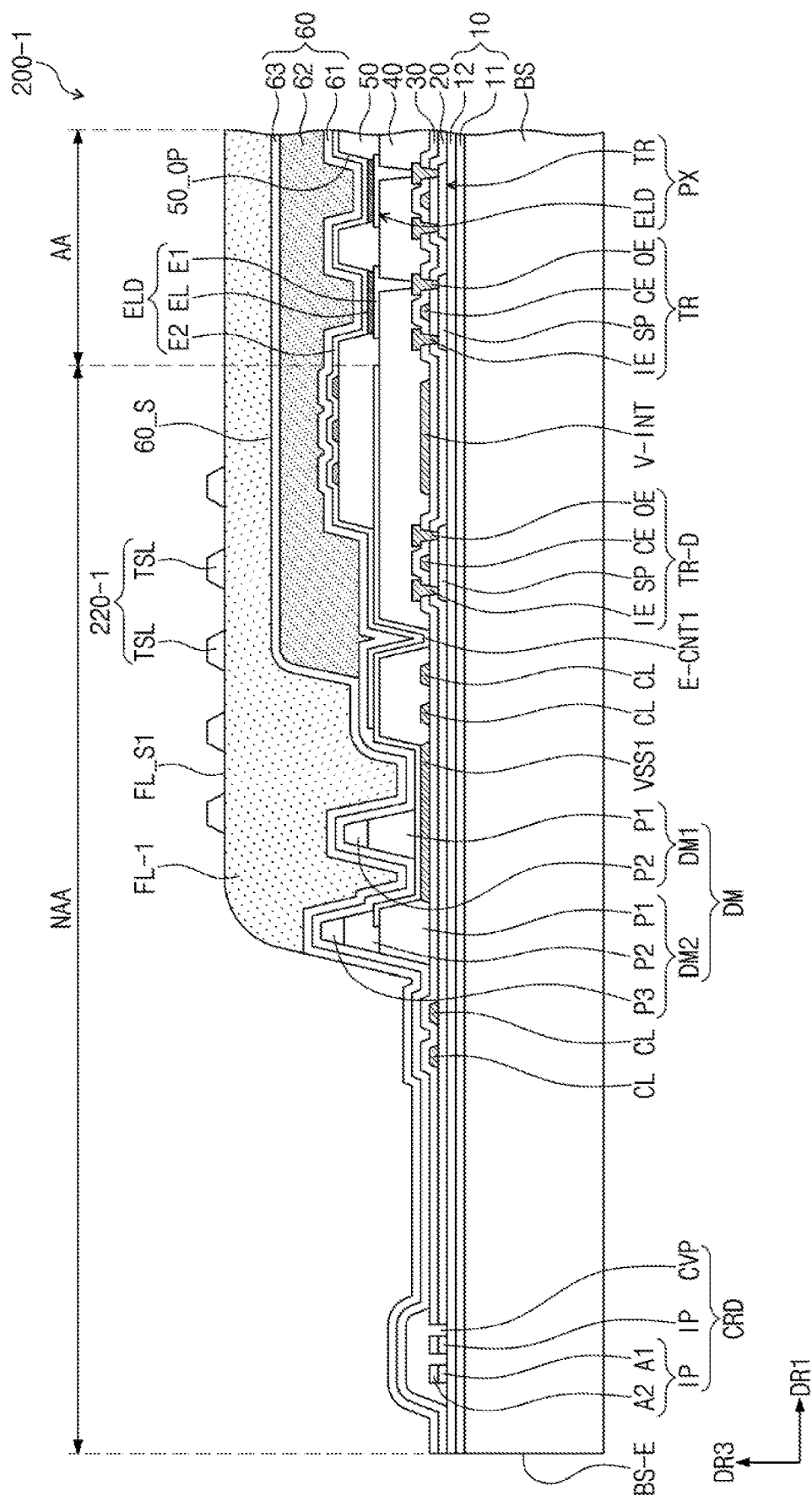
FIGS. 4A to 4C are cross-sectional views of an electronic panel according to an exemplary embodiment of the present inventive concept.
Figure 4B:
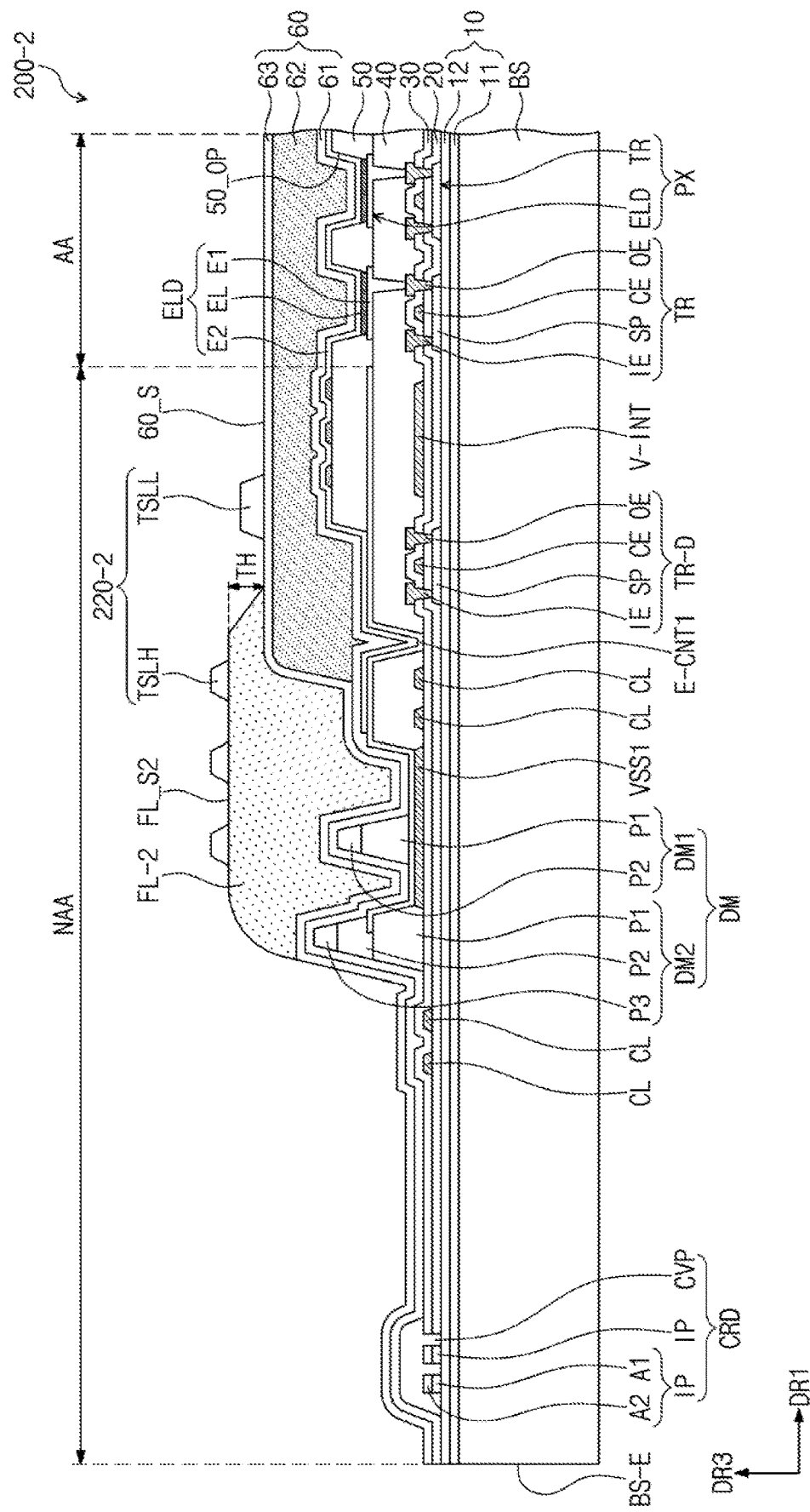
Figure 4C:
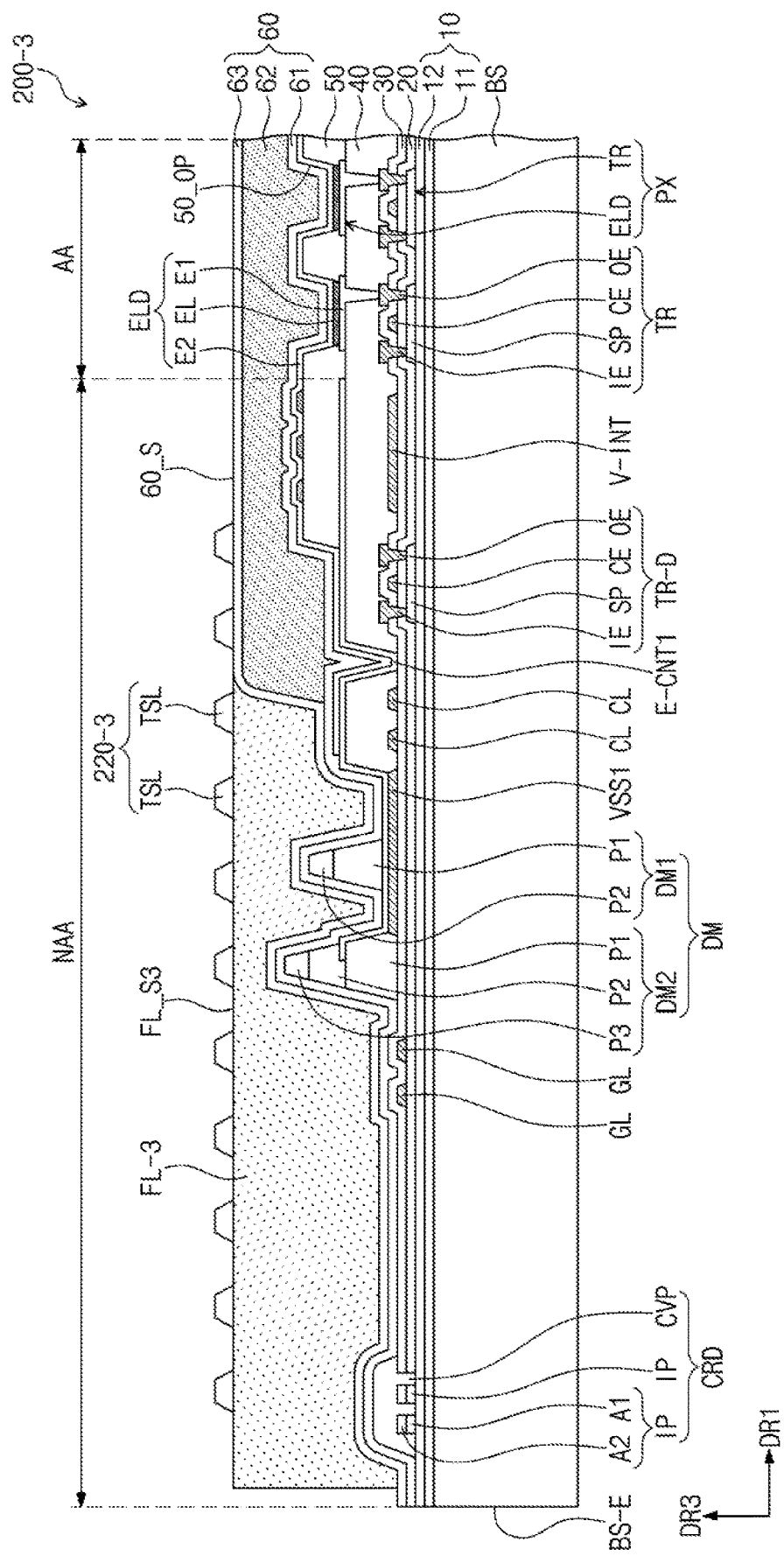

FIGS. 4A to 4C are cross-sectional views of an electronic panel according to an exemplary embodiment of the present inventive concept. In FIGS. 4A to 4C, for ease of explanation, areas corresponding to FIG. 3A are shown, and substantially identical configurations are shown except for the planarization layer FL (see FIG. 3A). Hereinafter, the present inventive concept will be described with reference to FIGS. 4A to 4C. Moreover, the same components as those described with reference to FIGS. 1A to 3C are given by the same reference numerals and redundant description will be omitted.

As shown in FIG. 4A, in the electronic panel 200-1, the planarization layer FL-1 may extend to the active area AA. The planarization layer FL-1 may cover at least a part of the peripheral area NAA and the active area AA. For example, the planarization layer FL-1 may cover the flat surface 60_S of the sixth insulating layer 60 (the encapsulation layer) entirely. The planarization layer FL-1 provides a flat surface FL_S1 having substantially the same plane in both the peripheral area NAA and the active area AA.

An input sensing unit 220-1 including detection lines TSL is disposed on the flat surface FL_S1. According to the present inventive concept, as the flat surface FL_S1 of the active area AA and the peripheral area NAA is formed by one planarization layer FL-1, flatness of the flat surface FL_S1 may be uniformly and continuously displayed in the active area AA and the peripheral area NAA. Thus, the input sensing unit 220-1 may be indirectly disposed on the flat surface 60_S and on the non-flat surface of the sixth insulating layer 60 (the encapsulation layer). Therefore, the area of the input sensing unit 220-1 disposed on the display unit 210 may be easily secured. Thus, the process reliability of the input sensing unit 220-1 may be enhanced and the electrical reliability may be enhanced.

Alternatively, as shown in FIG. 4B, in the electronic panel 200-2, the planarization layer FL-2 may cover a part of the flat surface 60_S formed by the sixth insulating layer 60. For example, the planarization layer FL-2 may cover a non-flat surface of the sixth insulating layer 60 and extend to cover some area of the flat surface 60_S. In other words, at least a part of the planarization layer FL-2 may cover the flat surface 60_S of the sixth insulating layer 60 (the encapsulation layer).

The planarization layer FL-2 has a predetermined thickness TH on the flat surface 60_S formed by the sixth insulating layer 60. Accordingly, the flat surface FL_S2 defined by the planarization layer FL-2 and the flat surface 60_S formed by the sixth insulating layer 60 may define different planes. In the present exemplary embodiment, the flat surface FL_S2 defined by the planarization layer FL-2 is further spaced toward the third direction DR3 as compared to the flat surface 60_S formed by the sixth insulating layer 60.

The input sensing unit 220-2 may include a detection line TSLL disposed on the flat surface 60_S formed by the sixth insulating layer 60, and a detection line TSLH disposed on the flat surface FL_S2 defined by the planarization layer FL-2. The flat surface 60_S formed by the sixth insulating layer 60 and the flat surface FL_S2 defined by the planarization layer FL-2 may define different planes but define flat surfaces, respectively. Accordingly, each of the two detection lines TSLL and TSLH is formed on a flat surface so that it may be stably formed.

Alternatively, as shown in FIG. 4C, in the electronic panel 200-3, the planarization layer FL-3 may cover the crack dam CRD. The flat surface FL_S3 defined by the planarization layer FL-3 may extend to the area adjacent to the side surface BS-E of the base substrate BS.

According to the present inventive concept, the input sensing unit 220-3 may also be formed in an area other than the area where the organic layer 62 is disposed, so that the area where the input sensing unit 220-3 may be disposed may be increased. In addition, as the area where the detection lines TSL disposed in the peripheral area NAA may be disposed is increased, the input sensing unit 220-3 may be designed to include a greater number of detection lines TSL or increase the spacing between detection lines TSL. Thus, the electronic panel 200-3 with enhanced electrical reliability and enhanced sensitivity may be provided.

Figure 5A:
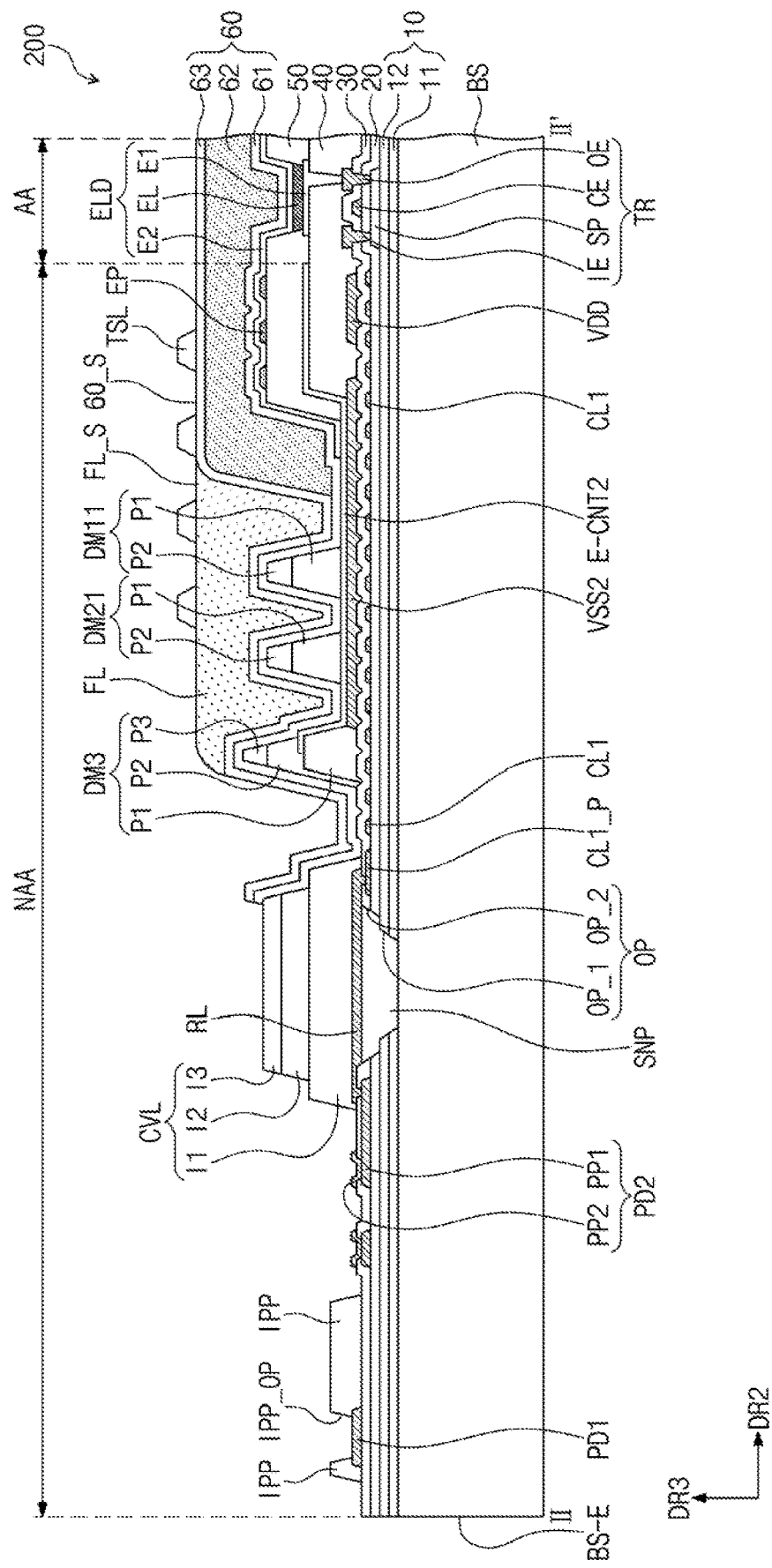
FIGS. 5A to 5C are cross-sectional views of an electronic panel according to an exemplary embodiment of the present inventive concept.
Figure 5B:
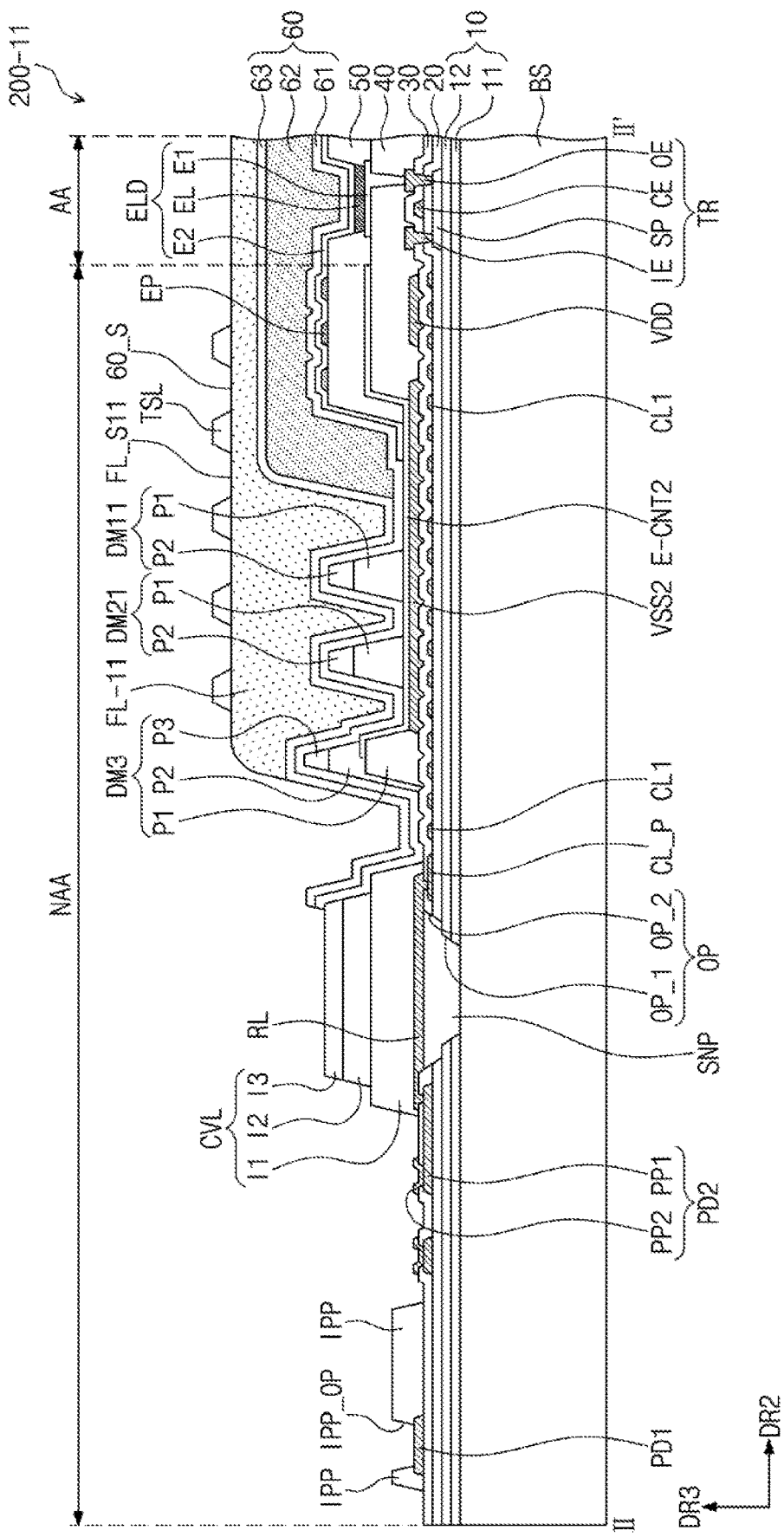
Figure 5C:
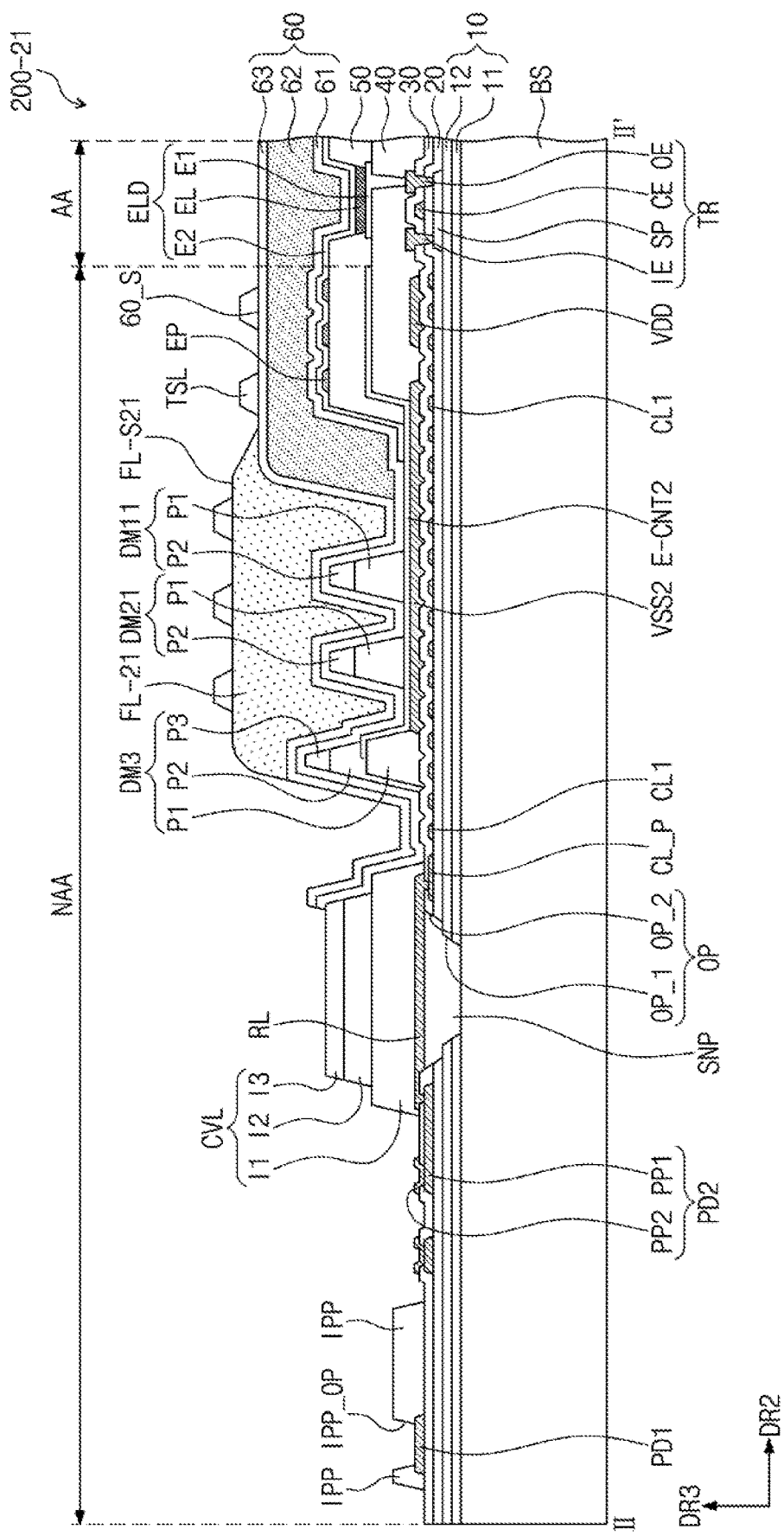

FIGS. 5A to 5C are cross-sectional views of an electronic panel 200 according to an exemplary embodiment of the present inventive concept. FIG. 5A is a cross-sectional view taken along line II-II' shown in FIG. 2B, and FIGS. 5B and 5C show areas corresponding to FIG. 5A. Hereinafter, the present inventive concept will be described with reference to FIGS. 5A to 5C. Meanwhile, the same components as those described with reference to FIGS. 1A to 4C are given by the same reference numerals and redundant description will be omitted.

The area shown in FIG. 5A may be the lower end area of the electronic panel 200 including the side surface BS-E1 adjacent to the pad area PA (see FIG. 2B) among the side surfaces of the base substrate BS. As shown in FIG. 5A, a plurality of pads PD1 and PD2, a stress relaxation pattern SNP, a first power supply pattern VDD, a second power supply pattern VSS2, a connection electrode E-CNT2, and a plurality of conductive lines CL1 may be disposed in the lower end area of the electronic panel 200.

The pads PD1 and PD2 may include a first pad PD1 and a second pad PD2. The first pad PD1 is disposed on the third insulating layer 30. Although the first pad PD1 is shown as a single layer structure, this is illustratively shown. The first pad PD1 according to an exemplary embodiment of the present inventive concept may have a structure in which a plurality of layers are stacked, and is not limited to any one exemplary embodiment.

The first pad PD1 may be at least partially exposed by an insulating pattern IPP. The insulating pattern IPP is disposed on the third insulating layer 30. The opening part IPP_OP defined in the insulating pattern IPP exposes at least a part of the first pad PD1. The circuit substrate 300 (see FIG. 1B) is connected to the exposed portion of the first pad PD1 and is electrically connected to the electronic panel 200.

The second pad PD2 is shown as a laminated structure. For example, the second pad PD2 includes a first pattern PP1 disposed on the second insulating layer 20 and a second pattern PP2 disposed on the third insulating layer 30. The second pattern PP2 is connected to the first pattern PP1 through the third insulating layer 30. The circuit substrate 300 may be electrically connected to the electronic panel 200 through the second pattern PP2.

The first pad PD1 and the second pad PD2 may receive substantially different electrical signals. For example, the first pad PD1 may be one of the display pads PDD (see FIG. 2C) and the second pad PD2 may be one of the detection pads PDT (see FIG. 2C). According to the present inventive concept, one electronic panel 200 may include a signal for detecting the input sensing unit 220 (see FIG. 2C) and a signal for driving the display unit 210 (see FIG. 2C). Thus, the degree of integration of the electronic panel 200 may be enhanced and the thickness of the electronic device EA (see FIG. 1A) may be reduced.

In the present exemplary embodiment, the first pad PD1 and the second pad PD2 are shown arranged in the second direction DR2. However, this is illustratively shown for ease of explanation, in the electronic panel 200 according to an exemplary embodiment of the present inventive concept, the first pad PD1 and the second pad PD2 may be arranged along the first direction DR1 and are not limited to any one exemplary embodiment.

The stress relaxation pattern SNP is disposed in the peripheral area NAA. In the present exemplary embodiment, for easy explanation, the width in the second direction DR2 is displayed relatively narrow compared to other structures. FIG. 5A shows one routing wire RL connected to any one CL1_P of the conductive lines CL1 for ease of explanation.

The routing wire RL may include at least one of a signal line connecting between the first pad PD1 and the display unit 210 and a signal line connecting between the second pad PD2 and the input sensing unit 220. The routing wire RL shown in FIG. 5A shows one routing wire RL connected to any one conductive line CL1_P of the conductive lines CL1. The routing wire RL electrically connects the first pattern PP1 constituting the first pad PD1 and one conductive line CL1_P. Thus, even if a part of the panel is bent, an electrical signal received through the first pad PD1 may be received by the corresponding conductive line CL1_P through the routing wire RL and provided to the active area AA.

The stress relaxation pattern SNP may include organic matter. The stress relaxation pattern SNP may be disposed on the opening part OP defined in the insulating layer. The opening part OP may be formed by connecting an opening part OP_1 passing through the first insulating layer 10 and an opening part OP_2 passing through the second insulating layer 20 and the third insulating layer 30.

The stress relaxation pattern SNP relaxes the bending stress applied when a part of the electronic panel 200, for example, the bending part BR, is bent. Thus, damage to the routing wires RL disposed on the stress relaxation pattern SNP may be prevented when the bending part BR is bent. Thus, the reliability of the electronic panel 200 may be enhanced.

The first power supply pattern VDD is connected to the first power supply line PL described above. The first power supply pattern VDD is connected to a pad to which the first power supply signal is applied among the pads PD1 and PD2 through any one of the routing wires RL to receive the first power supply signal. The first power supply pattern VDD may be connected to the plurality of first power supply lines PL to provide the same first power supply signal or voltage to each of the first power supply lines PL. However, this is illustratively shown, and the first power supply pattern VDD in the electronic panel 200 may be omitted and is not limited to any one exemplary embodiment.

The second power supply pattern VSS2 is disposed on the third insulating layer 30. The second power supply pattern VSS2 is connected to a pad to which the second power supply signal or voltage is applied among the pads PD1 and PD2 through any one of the routing wires RL to receive the second power supply signal or voltage. The second power supply pattern VSS2 is connected to the above-described power supply line VSS1 (see FIG. 3A).

The connection electrode E-CNT2 may be disposed on the fourth insulating layer 40 and on a layer the same as that of the first electrode E1. The connection electrode E-CNT2 covers the upper surface of the second power supply pattern VSS2 and may be connected to the second power supply pattern VSS2. The second electrode E2 extends from the active area AA and is connected to the connection electrode E-CNT2. For example, the second electrode E2 may be arranged on an entire surface of the active area AA, and may be formed as one body to cover a plurality of pixels. The second electrode E2 may extend to a portion of the peripheral area NAA to connect to the connection electrode E-CNT2. Accordingly, the second power supply signal or voltage transmitted to the second power supply pattern VSS2 may be easily transmitted to the second electrode E2. The connection electrode E-CNT2 may substantially have a configuration the same as that of the connection electrode E-CNT1 (see FIG. 3A) shown in FIG. 3A.

A plurality of conductive lines CL1 are disposed between the second insulating layer 20 and the third insulating layer 30. In the present exemplary embodiment, the conductive lines CL1 may be disposed on a layer the same as that of the control electrode CE. The conductive lines CL1 may include at least one of a data line, a gate line, and various control signal lines electrically connected to the active area AA.

The electronic panel 200 may include dam parts DM11, DM21, and DM3. The dam parts DM11, DM21, and DM3 may include a first dam part DM11, a second dam part DM12, and a third dam part DM3. The first to third dam parts DM11, DM21, and DM3 are sequentially arranged along the direction away from the active area AA, that is, the opposite direction to the second direction DR2 indicated by the arrow.

The dam parts DM11, DM21, and DM3 prevent the organic layer 62 from overflowing. The dam parts DM11, DM21, and DM3 may have an integral shape connected to the dam parts DM1 and DM2 shown in FIG. 3C or may be separately disposed. Each of the dam parts DM11, DM21 and DM3 may include two layers P1 and P2 or three layers P1, P2 and P3. Although it is shown in FIGS. 5A-5C that the dam parts DM11 and DM21 have a double-layered structure and the dam part DM3 has a triple-layered structure, the present inventive concept is not limited thereto. For example, in an exemplary embodiment of the present inventive concept, each of the dam parts DM11, DM21 and DM3 may have a single-layered structure or a triple or more layered structure. The dam parts DM11, DM21, and DM3 may have various structures and are not limited to any one exemplary embodiment.

According to the present inventive concept, the planarization layer FL may be disposed on the dam parts DM11, DM21, and DM3. The planarization layer FL may cover a non-flat surface that is not covered by the organic layer 62 to provide a flat surface. Accordingly, the placement area of the detection lines TSL may be increased, so that the input sensing unit 220 may be stably formed on the display unit 210. For example, the display unit 210 may include the dam parts DM11, DM21, and DM3 disposed in the peripheral area NAA and non-overlapping the organic layer 62 in a plan view, in which the planarization layer FL may be disposed overlapping the dam parts DM11, DM21, and DM3 in a plan view.

Alternatively, as shown in FIG. 5B, in the electronic panel 200-11, the planarization layer FL-11 may cover at least a part of the active area AA. In the present exemplary embodiment, the planarization layer FL-11 extends to the active area AA to provide a flat surface FL_S11 on the upper part. For example, the planarization layer FL-11 may cover the flat surface 60_S of the sixth insulating layer 60 (the encapsulation layer) entirely. The planarization layer FL-11 provides a flat surface FL_S11 having substantially the same plane in both the peripheral area NAA and the active area AA. The planarization layer FL-11 may substantially correspond to the planarization layer FL-1 shown in FIG. 4A.

Alternatively, as shown in FIG. 5C, in the electronic panel 200-21, the flat surface FL_S21 formed by the planarization layer FL-21 may define a plane different from the flat surface 60_S of the sixth insulating layer 60 due to a process error or the like. The planarization layer FL-21 may cover a non-flat surface of the sixth insulating layer 60 and extend to cover some area of the flat surface 60_S. For example, at least a part of the planarization layer FL-21 may cover the flat surface 60_S of the sixth insulating layer 60 (the encapsulation layer). However, as each of the flat surfaces FL_S21 and 60_S provides a flat upper surface, the input sensing unit 220 including the detection lines TSL may be stably formed on the display unit 210. Further, according to the present inventive concept, the area where the detection lines TSL may be disposed may extend to the area overlapping the dam parts DM11, DM21, and DM3, so that reduction of the active area AA may be prevented and utilization of the peripheral area NAA may be increased. The planarization layer FL-21 may substantially correspond to the planarization layer FL-2 shown in FIG. 4B.

Figure 6A:
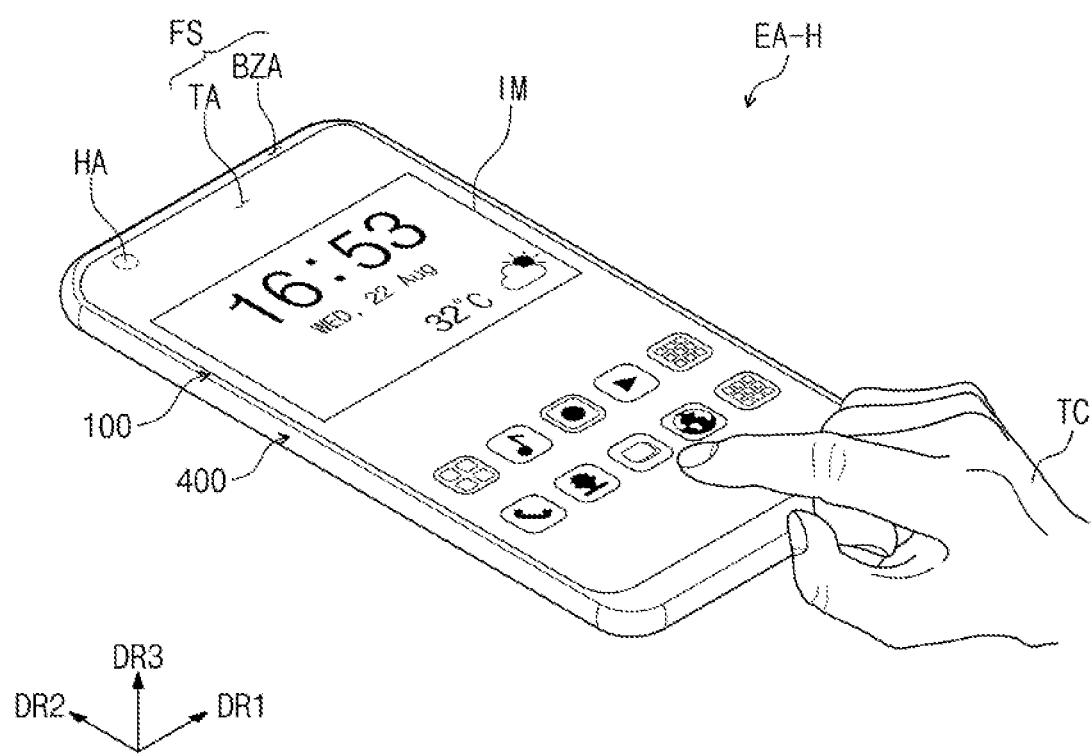
FIG. 6A is an assembled perspective view of an electronic device according to an exemplary embodiment of the present inventive concept.
Figure 6B:
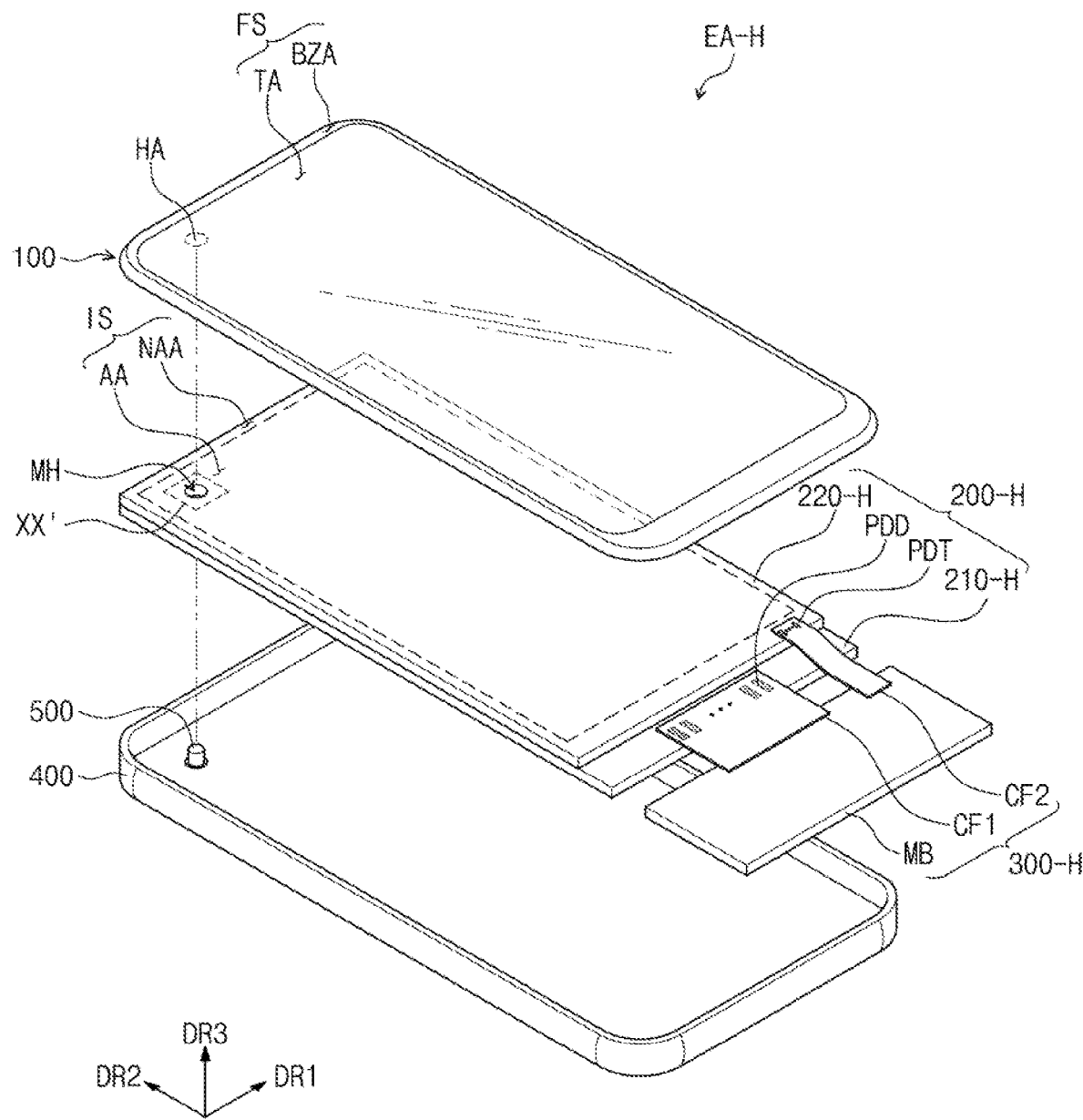
FIG. 6B is an exploded perspective view of the electronic device shown in FIG. 6A.
Figure 6C:
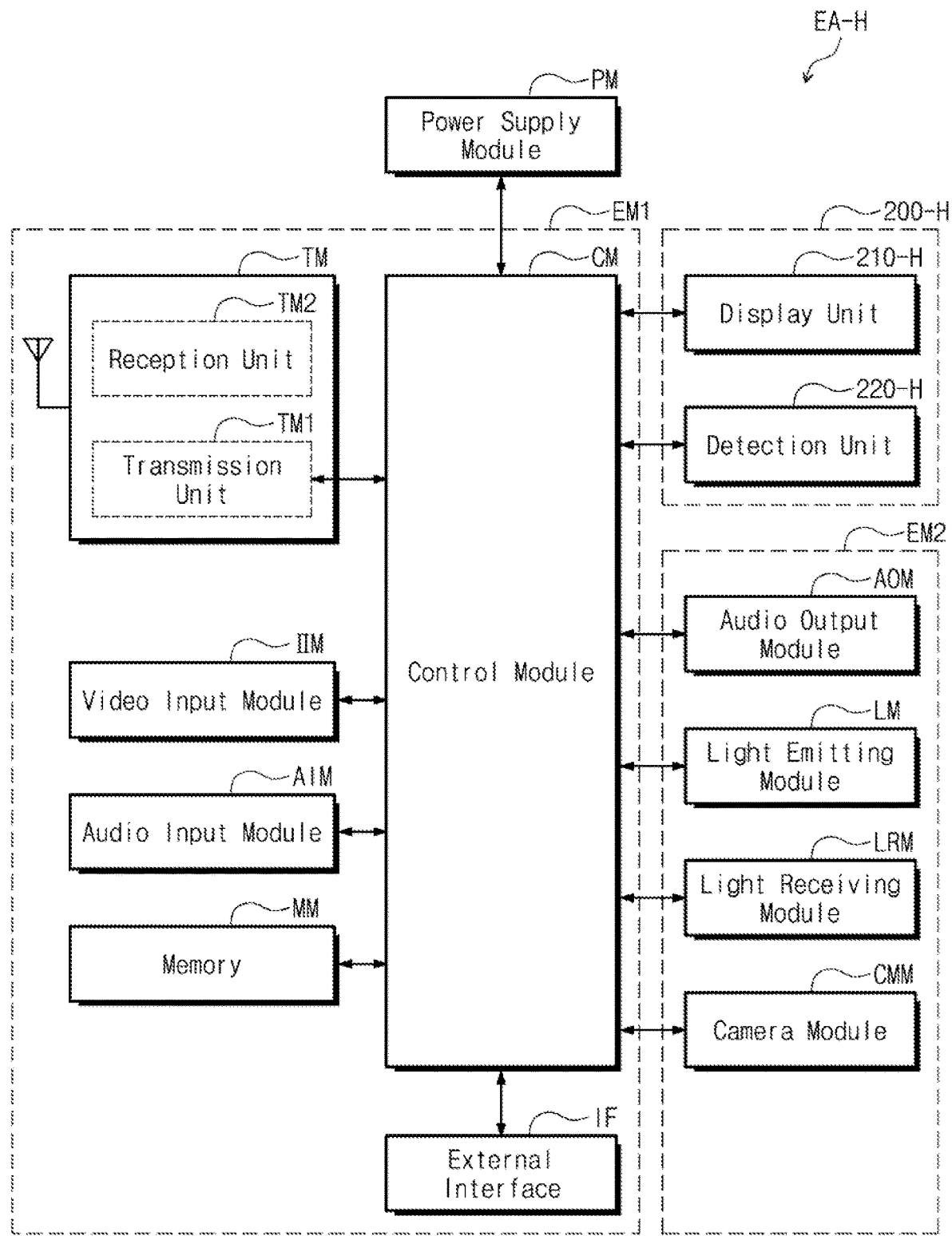
FIG. 6C is a block diagram of an electronic device according to an exemplary embodiment of the present inventive concept.

FIG. 6A is an assembled perspective view of an electronic device according to an exemplary embodiment of the present inventive concept. FIG. 6B is an exploded perspective view of the electronic device shown in FIG. 6A. FIG. 6C is a block diagram of an electronic device according to an exemplary embodiment of the present inventive concept. Hereinafter, the present inventive concept will be described with reference to FIGS. 6A to 6C. Meanwhile, the same components as those described with reference to FIGS. 1A to 5C are given by the same reference numerals and redundant description will be omitted.

The electronic device EA-H may display the image IM through an active area AA activated by an electrical signal and detect an external input TC. In the electronic device EA-H according to the present exemplary embodiment, a hole area HA may be defined on the front surface FS. The electronic device EA-H may include a window 100, an electronic panel 200-H, a circuit substrate 300-H, an external case 400, and an electronic module 500. Since the window 100 and the external case 400 correspond to the window 100 and the external case 400 shown in FIG. 1B, a duplicated description will be omitted.

In the present exemplary embodiment, the electronic panel 200-H is assembled in a flat state in which the active area AA and the peripheral area NAA face the window member 100. However, this is illustratively shown, and a part of the peripheral area NAA of the electronic panel 200-H may be assembled in a bent state like the electronic panel 200 (see FIG. 2B) shown in FIG. 2B.

The electronic panel 200-H includes a display unit 210-H and an input sensing unit 220-H. The display unit 210-H may be configured to substantially generate an image IM, and the input sensing unit 220 may be configured to detect an external input TC. Meanwhile, in FIG. 6B, the display unit 210-H and the input sensing unit 220-H are shown as separate layers for ease of explanation.

The circuit substrate 300-H is electrically connected to the display unit 210-H and the input sensing unit 220-H, and includes a main circuit substrate MB, a first flexible film CF1, and a second flexible film CF2.

The first flexible film CF1 is electrically connected to the display unit 210, and may connect the display unit 210-H and the main circuit substrate MB. The first flexible film CF1 may include an insulating film and conductive wires mounted on the insulating film. The first flexible film CF1 may be connected to the pads (display pads PDD) of the display unit 210-H disposed in the peripheral area NAA to electrically connect the main circuit substrate MB and the display unit 210-H. The first flexible film CF1 provides to the display unit 210-H an electrical signal for driving the display unit 210-H. The electrical signal may be generated in the first flexible film CF1 or generated in the main circuit substrate MB.

The second flexible film CF2 is electrically connected to the input sensing unit 220-H, and may connect the input sensing unit 220-H and the main circuit substrate MB. The second flexible film CF2 may include an insulating film and conductive wires mounted on the insulating film. In the present exemplary embodiment, the second flexible film CF2 may be connected to pads (detection pads PDT) of the input sensing unit 220-H disposed in the peripheral area NAA to electrically connect the main circuit substrate MB and the input sensing unit 220-H. The second flexible film CF2 provides to the input sensing unit 220-H an electrical signal for driving the input sensing unit 220-H. The electrical signal may be generated in the second flexible film CF2 or generated in the main circuit substrate MB.

The main circuit substrate MB may include various driving circuits for driving the electronic panel 200-H, or connectors for power supply. Each of the first flexible film CF1 and the second flexible film CF2 may be connected to the main circuit substrate MB. According to the present inventive concept, the electronic panel 200-H may be easily controlled through one main circuit substrate MB. However, this is illustratively shown, and the present inventive concept is not limited thereto. For example, in the electronic device EA-H according to an exemplary embodiment of the present inventive concept, the display unit 210-H and the input sensing unit 220-H may be connected to different main circuit substrates, and either the first flexible film CF1 or the second flexible film CF2 may not be connected to the main circuit substrate MB. This is not limited to any one exemplary embodiment. Alternatively, in an electronic device EA-H according to an exemplary embodiment of the present inventive concept, at least one of the first flexible film CF1 and the second flexible film CF2 may be omitted.

The electronic module 500 is disposed on the lower side of the window 100 and may be accommodated in the external case 400. Referring to FIG. 6C, the electronic device EA-H may include an electronic panel 200-H, a power supply module PM, a first electronic module EM1, and a second electronic module EM2. The electronic module 500 may include any one of the first electronic module EM1 and the second electronic module EM2.

The electronic panel 200-H, the power supply module PM, the first electronic module EM1, and the second electronic module EM2 may be electrically connected to each other. FIG. 6C exemplarily shows the display unit 210-H and the input sensing unit (detection unit) 220-H in the configuration of the electronic panel 200-H.

The power supply module PM supplies power necessary for the overall operation of the electronic device EA-H. The power supply module PM may include a typical battery module.

The first electronic module EM1 and the second electronic module EM2 include various functional modules for operating the electronic device EA-H. The first electronic module EM1 may be directly mounted on a motherboard electrically connected to the electronic panel 200-H or may be mounted on a separate substrate and electrically connected to the motherboard through a connector or the like.

The first electronic module EM1 may include a control module CM, a wireless communication module TM, a video input module IIM, an audio input module AIM, a memory MM, and an external interface IF. Some of the modules may not be mounted on the motherboard, but may be electrically connected to the motherboard through a flexible circuit substrate.

The control module CM controls the overall operation of the electronic device EA-H. The control module CM may be a microprocessor. For example, the control module CM activates or deactivates the electronic panel 200-H. The control module CM may control other modules such as the image input module (video input module) IIM or the audio input module AIM based on the touch signal received from the electronic panel 200-H.

The wireless communication module (TM) may transmit/receive a wireless signal to/from another terminal using a Bluetooth or a Wi-Fi line. The wireless communication module TM may transmit/receive a voice signal using a general communication line. The wireless communication module TM includes a transmission unit TM1 for modulating and transmitting a signal to be transmitted, and a reception unit TM2 for demodulating the received signal.

The image input module (video input module) IIM processes the image signal and converts it into image data that may be displayed on the electronic panel 200-H, for example, displayed on the display unit 210-H. The audio input module AIM receives an external audio signal by a microphone in a recording mode, a voice recognition mode, etc., and converts it into electrical voice data.

The external interface IF serves as an interface to an external charger, a wired/wireless data port, a card socket (e.g., a memory card, a SIM/UIM card).

The second electronic module EM2 may include an audio output module AOM, a light emitting module LM, a light receiving module LRM, and a camera module CMM. The configurations may be directly mounted on the motherboard, or mounted on a separate substrate and electrically connected to the electronic panel 200-H through a connector, or electrically connected to the first electronic module EM1.

The audio output module AOM converts the audio data received from the wireless communication module TM or the audio data stored in the memory MM and outputs the audio data to the outside.

The light emitting module LM generates and outputs light, and may output infrared rays. For example, the light emitting module LM may include an LED element. For example, the light receiving module LRM may detect infrared rays. The light receiving module LRM may be activated when an infrared ray of a predetermined level or higher is detected. The light receiving module LRM may include a CMOS sensor. After the infrared light generated by the light emitting module LM is outputted, the infrared light is reflected by an external object (e.g., a user finger or a face), and the reflected infrared light may be incident on the light receiving module LRM. The camera module CMM captures an image of the outside.

The electronic module 500 according to an exemplary embodiment of the present inventive concept may include at least one of the configurations of the first electronic module EM1 and the second electronic module EM2. For example, the electronic module 500 may include at least one of a camera, a speaker, a light detection sensor, and a thermal detection sensor. The electronic module 500 may detect an external object received through the hole area HA or provide a sound signal such as voice to the outside through the hole area HA. In addition, the electronic module 500 may include a plurality of configurations, and is not limited to any one exemplary embodiment.

The electronic module 500 is disposed so as to overlap the electronic panel 200-H in a plan view. The electronic module 500 may be disposed overlapping with the hole area HA.

In the area corresponding to the hole area HA of the electronic panel 200-H according to an exemplary embodiment of the present inventive concept, a portion of the display units 210-H may be removed or a portion of the input sensing units 220-H may be removed. In the electronic panel 200-H, the hole area HA may have a relatively high transmittance as compared with a general active area AA. Accordingly, the electronic module 500 disposed overlapping with the hole area HA may easily visualize the external object through the hole area HA, and the output signal generated by the electronic module 500 may be easily transmitted to the outside.

As shown in FIG. 6B, a predetermined hole MH (hereinafter, panel hole) corresponding to the hole area HA may be defined in the electronic panel 200-H. The panel hole MH may be defined in an area overlapping with the hole area HA in a plan view. The panel hole MH is defined in the active area AA and passes through the electronic panel 200. The display unit 210 and the input sensing unit 220 may be penetrated by the panel hole MH. The electronic module 500 may be disposed to overlap the panel hole MH. Accordingly, even if the electronic module 500 is assembled to overlap the electronic panel 200-H in a plan view, it may easily communicate with the outside through the panel hole MK Therefore, the area of the bezel area BZA of the electronic device EA-H may be reduced, so that the aesthetics of the electronic device EA-H may be enhanced.

Figure 7A:
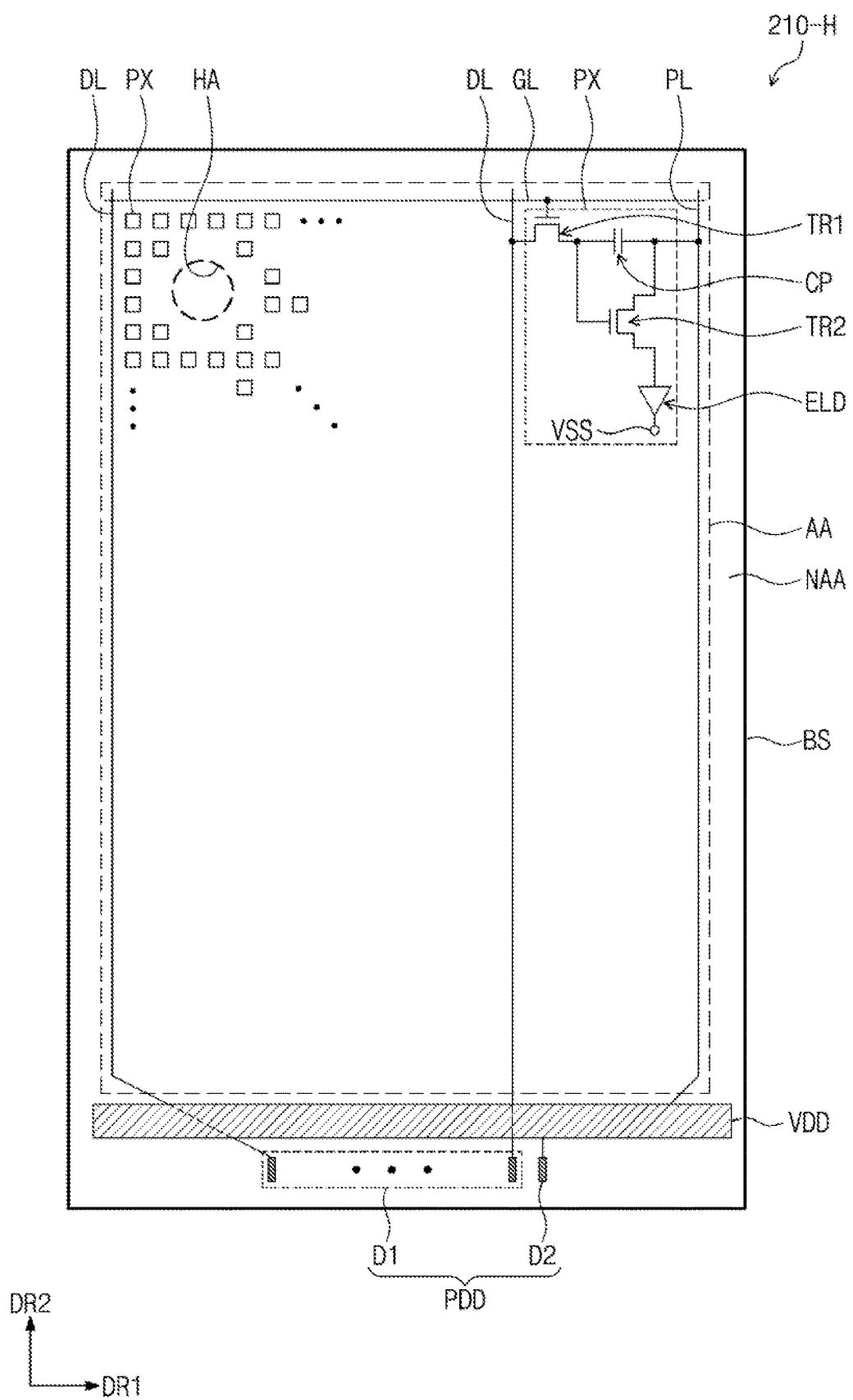
FIG. 7A is a plan view of a display unit according to an exemplary embodiment of the present inventive concept.
Figure 7B:
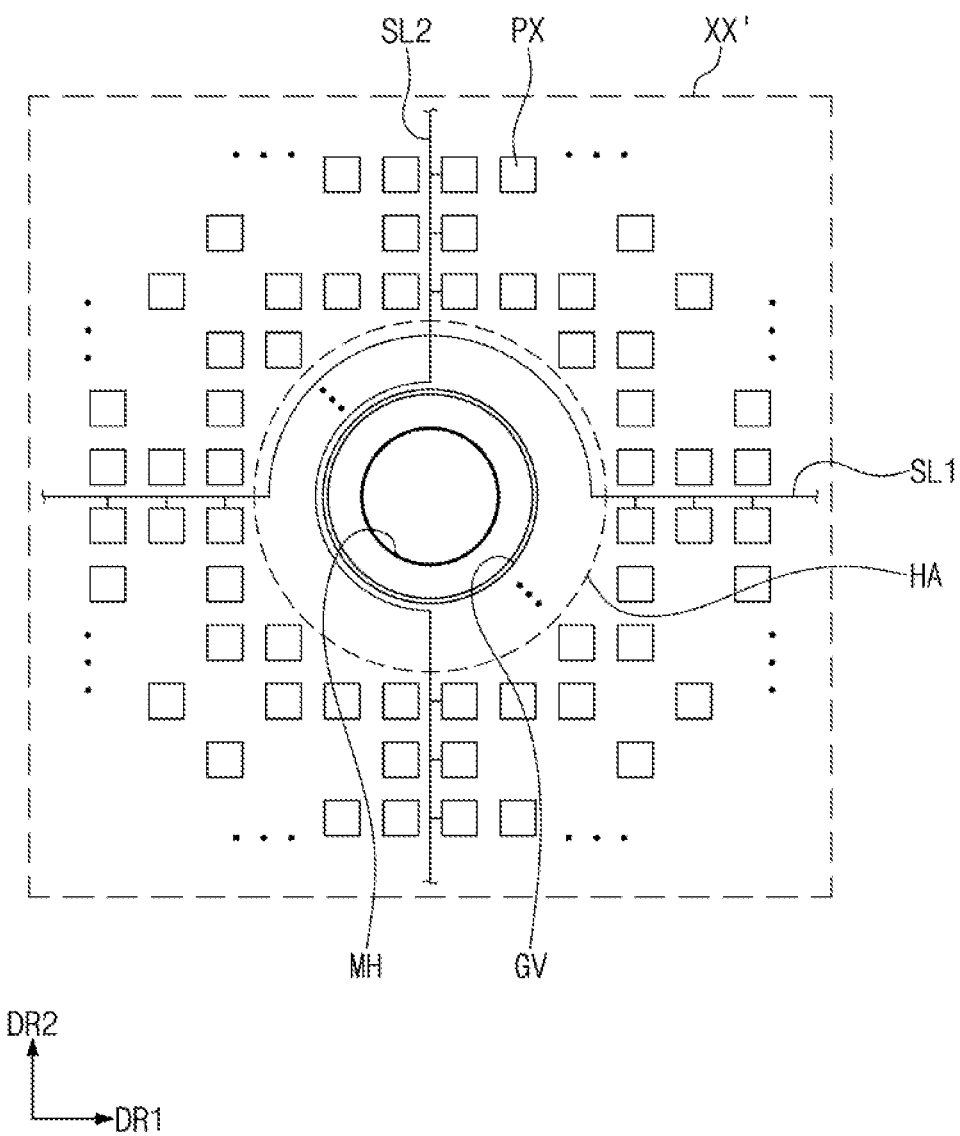
FIG. 7B is a plan view showing an enlarged partial area of FIG. 7A.
Figure 7C:
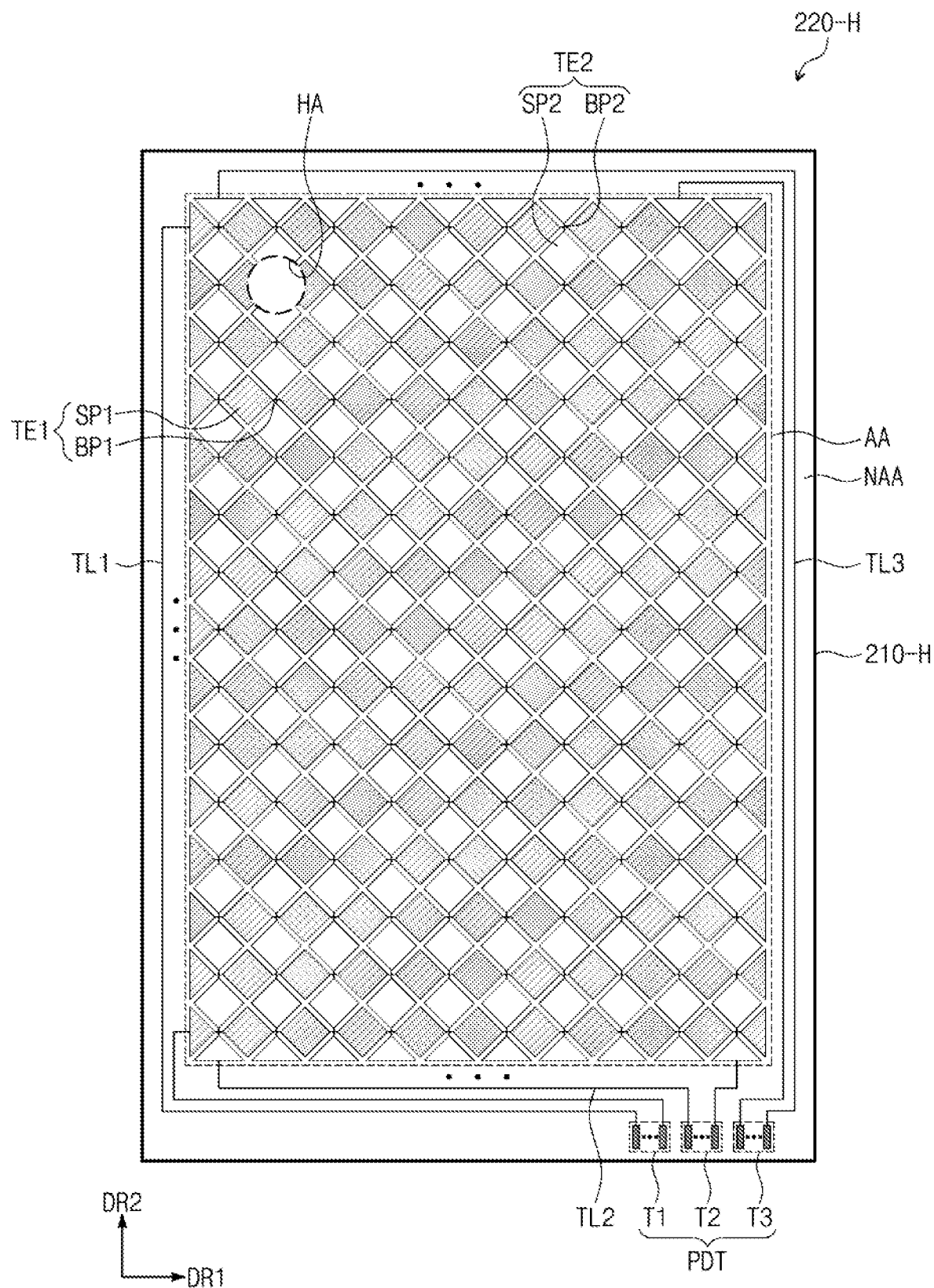
FIG. 7C is a plan view of a sensing unit according to an exemplary embodiment of the present inventive concept.

FIG. 7A is a plan view of a display unit according to an exemplary embodiment of the present inventive concept. FIG. 7B is a plan view showing an enlarged partial area of FIG. 7A. FIG. 7C is a plan view of an input sensing unit according to an exemplary embodiment of the present inventive concept. FIG. 7B schematically shows an area corresponding to the area XX' shown in FIG. 6B in the display units 210-H, and some components are omitted for ease of explanation in FIGS. 7A to 7C. Hereinafter, the present inventive concept will be described with reference to FIGS. 7A to 7C. Meanwhile, the same components as those described with reference to FIGS. 1A to 6C are given by the same reference numerals and redundant description will be omitted.

As shown in FIG. 7A, the display unit 210-H includes a base substrate BS, a plurality of pixels PX, a plurality of signal lines GL, DL, and PL, and a plurality of display pads PDD. The active area AA and the peripheral area NAA may be areas provided by the base substrate BS. The base substrate BS may include an insulating substrate. For example, the base substrate BS may be composed of a glass substrate, a plastic substrate, or a combination thereof. The base substrate BS may be flexible so as to be bendable. For example, the base substrate BS may be an insulating polymer film. The insulating polymer film may include a polymer film material (e.g., polyimide) that has excellent ductility. The description of the pixels PX, the signal lines GL, DL, and PL, and the display pads PDD will be omitted.

In the display unit 210-H, some of the configurations of the display unit 210-H may be removed in the area corresponding to the hole area HA. At least some of the pixels PX may not be disposed in the hole area HA. In other words, at least some of the pixels PX may be removed in the hole area HA.

Referring to FIG. 7B, the pixels PX are arranged adjacent to the hole area HA. In the present exemplary embodiment, the pixels PX are not disposed in the hole area HA. The pixels PX may be arranged along the edge of the hole area HA. However, this is illustratively shown, and some of the pixels PX may be disposed in the hole area HA. However, with respect to the same area, the number of the pixels PX arranged in the hole area HA may be smaller than the number of the pixels PX disposed in the active area AA.

In the present exemplary embodiment, a panel hole MH passing through the display unit 210-H is defined in the display unit 210-H. The panel hole MH is shown as being defined in the hole area HA. A plurality of signal lines SL1 and SL2 connected to the pixels PX may be disposed in the hole area HA. The signal lines SL1 and SL2 are connected to the pixels PX through the hole area HA. For ease of description, a first signal line SL1 and a second signal line SL2 among a plurality of signal lines connected to the pixels PX are exemplarily shown in FIG. 7B. Although one panel hole MH is shown as being defined in the hole area HA in FIGS. 7A and 7B, the present inventive concept is not limited thereto. For example, in an exemplary embodiment of the present inventive concept, two or more panel holes MH may be defined in the electronic panel 200-H.

The first signal line SL1 extends along the first direction DR1. The first signal line SL1 is connected to pixels in the same row arranged along the first direction DR1 of among the pixels PX. The first signal line SL1 is illustratively described as corresponding to the gate line GL.

Some of the pixels connected to the first signal line SL1 are disposed on the left side based on the panel hole MH and the other part is disposed on the right side based on the panel hole MH. The first signal line SL1 of the right side and the first signal line SL1 of the left side may be connected to each other with a portion of the first signal line SL1 disposed within the hole area HA and circumventing the panel hole MH. Accordingly, even if some pixels in the same row connected to the first signal line SL1 are omitted from the panel hole MH, they may be turned on/off by substantially the same gate signal.

The second signal line SL2 extends along the second direction DR2. The second signal line SL2 is connected to the pixels in the same column arranged along the second direction DR2 of the pixels PX. The second signal line SL2 is illustratively described as corresponding to the data line DL.

Some of the pixels connected to the second signal line SL2 are disposed on the upper side based on the panel hole MH and the other part is disposed on the lower side based on the panel hole MH. The second signal line SL2 of the upper side and the second signal line SL2 of the lower side may be connected to each other with a portion of the second signal line SL2 disposed within the hole area HA and circumventing the panel hole MH. Accordingly, even if some pixels around the panel hole MH are omitted, the pixels in the same column connected to the second signal line SL2 may receive the data signal through the same line.

The electronic panel 200-H according to an exemplary embodiment of the present inventive concept may further include a connection pattern disposed in the hole area HA. At this time, the first signal line SL1 may be disconnected in an area overlapping the hole area HA. The disconnected portions of the first signal line SL1 may be connected through a connection pattern. Similarly, the second signal line SL2 may be disconnected in the area overlapping the hole area HA, and a connection pattern connecting the disconnected portions of the second signal line may be further provided.

Referring to FIG. 7A again, the display pads PDD may include a first pad D1 and a second pad D2. The plurality of first pads D1 may be connected to the data lines DL, respectively.

The second pad D2 may be connected to the power supply pattern VDD and electrically connected to the power supply line PL. The display unit 210-H may provide electrical signals to the pixels PX externally provided through the display pads PDD. Meanwhile, the display pads PDD may further include pads for receiving electrical signals other than the first pads D1 and the second pads D2 and are not limited to any one exemplary embodiment. The first flexible film CF1 may be connected to the display pads PDD of the display unit 210-H disposed in the peripheral area NAA to electrically connect the main circuit substrate MB and the display unit 210-H as shown in FIG. 6B.

Referring to FIG. 7C, the input sensing unit 220-H is disposed on the display unit 210-H. The input sensing unit 220-H includes a first sensing electrode TE1, a second sensing electrode TE2, a plurality of detection lines TL1, TL2, and TL3, and a plurality of detection pads PDT.

It is shown that the first sensing electrode TE1 includes first detection patterns SP1 and first connection patterns BP1 connecting adjacent first detection patterns SP1. For example, the first sensing electrode TE1 may include a plurality of first detection patterns SP1 arranged along the first direction DR1 and electrically connected to each other by the first connection patterns BP1. It is shown that the second sensing electrode TE2 includes second detection patterns SP2 and second connection patterns BP2 connecting adjacent second detection patterns SP2. For example, the second sensing electrode TE2 may include a plurality of second detection patterns SP2 arranged along the second direction DR2 and electrically connected to each other by the second connection patterns BP2.

The first sensing electrode TE1 and the second sensing electrode TE2 are disposed in the active area AA. The input sensing unit 220-H may obtain information on the external input TC through a change in capacitance between the first sensing electrode TE1 and the second sensing electrode TE2.

The detection lines TL1, TL2, and TL3 are disposed in the peripheral area NAA. The detection lines TL1, TL2, and TL3 may include first detection lines TL1, second detection lines TL2, and third detection lines TL3. The first detection lines TL1 are connected to the first sensing electrodes TE1, respectively. The second detection lines TL2 are connected to one ends of the second sensing electrodes TE2, respectively.

The third detection lines TL3 are connected to the other ends of the second sensing electrodes TE2, respectively. The other ends of the second sensing electrodes TE2 may be portions opposite to the one ends of the second sensing electrodes TE2. According to the present inventive concept, the second sensing electrodes TE2 may be connected to the second detection lines TL2 and the third detection lines TL3. Accordingly, for the second sensing electrodes TE2 having a relatively longer length than the first sensing electrodes TE1, the sensitivity according to an area may be maintained uniformly. On the other hand, this is illustratively shown. The third detection lines TL3 may be omitted and are not limited to any one exemplary embodiment. Alternatively, in an exemplary embodiment of the present inventive concept, the first detection lines TL1 are connected to one ends of the first sensing electrodes TE1, and fourth detection lines may be added to connect to the other ends of the first sensing electrodes TE1 to enhance sensing sensitivity.

The detection pads PDT are disposed in the peripheral area NAA. The detection pads PDT may include first detection pads T1, second detection pads T2, and third detection pads T3. The first detection pads T1 are respectively connected to the first detection lines TL1 to provide an external signal to the first sensing electrode TEl. The second detection pads T2 are respectively connected to the second detection lines TL2 and the third detection pads T3 are respectively connected to the third detection lines TL3 to connect to the second sensing electrodes TE2. The second flexible film CF2 may be connected to detection pads PDT of the input sensing unit 220-H disposed in the peripheral area NAA to electrically connect the main circuit substrate MB and the input sensing unit 220-H as shown in FIG. 6B.

In the input sensing unit 220-H, some of the configurations of the input sensing unit 220-H may be removed in the area corresponding to the hole area HA. For example, at least a part of the first electrode TE1 and the second electrode TE2 may not be disposed in the hole area HA. In the present exemplary embodiment, the first electrode TE1 disposed overlapping with the hole area HA includes a first detection pattern of a partially removed shape, and the second electrode TE2 may include a second detection pattern of a partially removed shape.

In the present exemplary embodiment, a part of the first connection pattern BP1 may connect the two adjacent first detection patterns SP1 through the hole area HA. Also, a part of the second connection pattern BP2 may connect the two adjacent second detection patterns SP2 through the hole area HA. A connection pattern BP1 or BP2 disposed in the hole area HA among the connection patterns BP1 and BP2 may extend along an edge of the panel hole MH. According to the present inventive concept, a part of the sensing electrodes TE1 and TE2 in the area overlapping with the hole area HA is removed, so that the problem of covering the electronic module 500 by the first sensing electrode TE1 or the second sensing electrode TE2 may be prevented.

Figure 8:
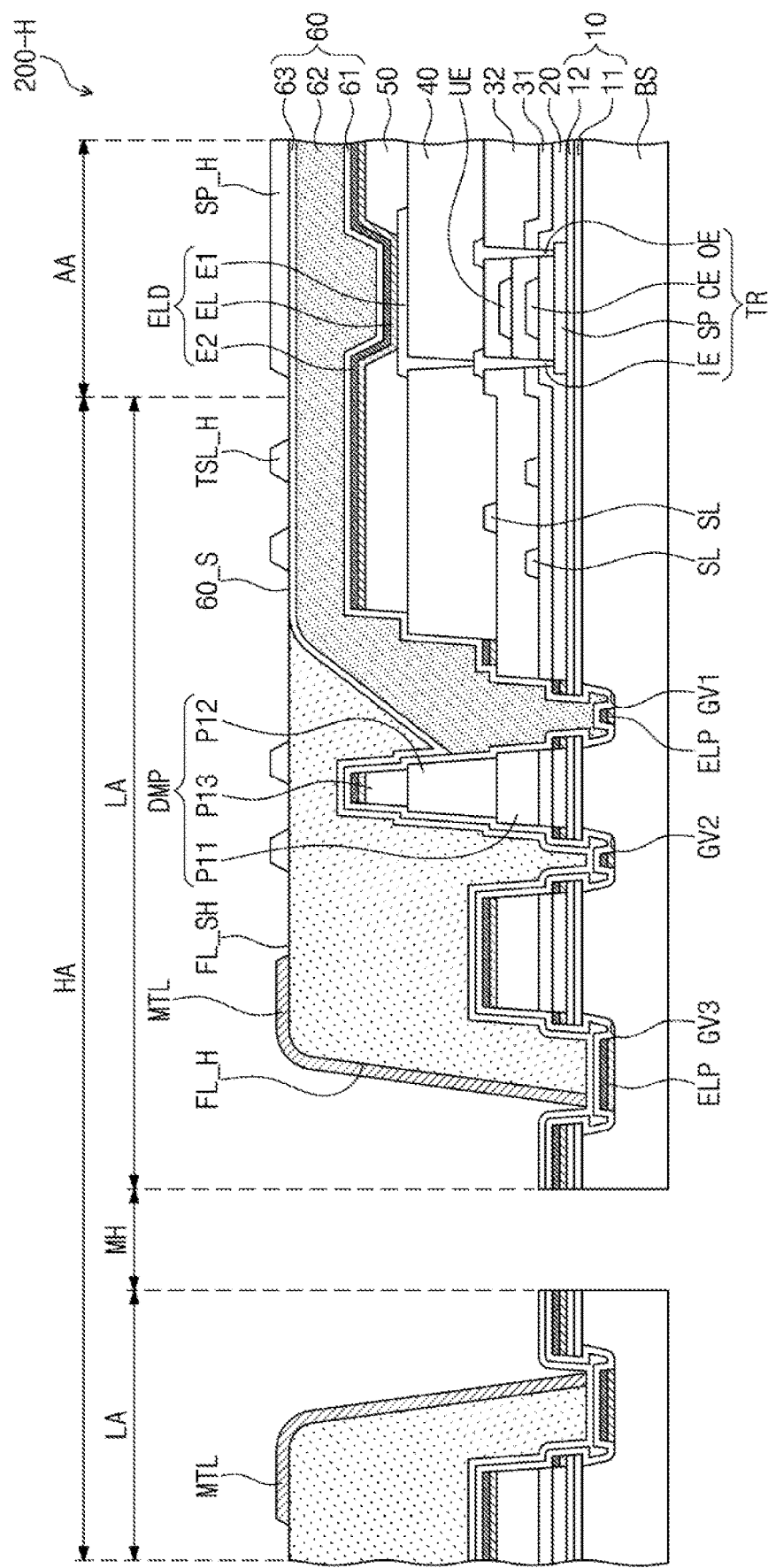
FIG. 8 is a cross-sectional view of an electronic panel according to an exemplary embodiment of the present inventive concept.

FIG. 8 is a cross-sectional view of an electronic panel according to an exemplary embodiment of the present inventive concept. FIG. 8 shows a cross-sectional view of an area where the panel hole MH of the electronic panel 200-H shown in FIG. 7A is disposed for ease of explanation. Hereinafter, the inventive concept will be described with reference to FIG. 8. Meanwhile, the same components as those described with reference to FIGS. 1A to 7C are given by the same reference numerals and redundant description will be omitted.

The width of the panel hole MH is shown relatively narrow in FIG. 8 for ease of explanation. As shown in FIG. 8, the hole area HA may include a panel hole MH and a wire area LA.

The panel hole MH passes through the electronic panel 200-H. Specifically, the panel hole MH may pass through the base substrate BS, the first insulating layer 10, the deposition pattern ELP, the first inorganic layer 61, and the second inorganic layer 63.

The deposition pattern ELP may include at least one of the light emitting layer EL and the second electrode E2 in the configuration of the light emitting element ELD. The deposition pattern ELP may be a pattern formed apart from the light emitting element ELD formed in the active area AA when the light emitting layer EL or the second electrode E2 is formed. On the other hand, in the electronic panel 200-H according to the present exemplary embodiment, the deposition pattern ELP may be omitted.

The wire area LA may be an area between the panel hole MH and the active area AA. The wire area LA may surround the panel hole MH in a plan view. In the wire area LA, the groove parts GV1, GV2 and GV3, the dam part DMP, the signal lines SL of the display unit 210-H, and the detection lines TSL_H of the input sensing unit 220-H may be disposed.

The groove parts GV1, GV2, and GV3 may be spaced apart from each other. The groove parts GV1, GV2 and GV3 formed sequentially in a direction away from the active area AA and approaching the panel hole MH are illustratively shown. Each of the first through third groove parts GV1, GV2 and GV3 has a closed line shape surrounding the panel hole MH or has an intermittent line shape surrounding at least a part of the edge of the panel hole MH and is not limited to any one exemplary embodiment.

Each of the groove parts GV1, GV2, and GV3 is defined as being recessed from the upper surface of the base substrate BS. Each of the groove parts GV1, GV2, and GV3 may be formed by removing at least a part of the base substrate BS. Each of the groove parts GV1, GV2 and GV3 may be provided with a deposition pattern ELP and may be covered by at least one of the first inorganic layer 61 and the second inorganic layer 63.

The electronic panel 200-H according to the present inventive concept further includes the groove parts GV1, GV2, and GV3, thereby blocking the continuity between the deposition pattern ELP and the light emitting element ELD. Thus, it is possible to prevent damage to elements disposed in the active area AA by cutting off the infiltration path of external moisture or oxygen.

The deposition pattern ELP disposed in each of the groove parts GV1, GV2 and GV3 is covered by the first inorganic layer 61 or the second inorganic layer 63, so that it is possible to prevent the deposition pattern ELP from being transferred to other devices and affecting them during the manufacturing process of the electronic panel 200-H. Thus, the process reliability of the electronic panel 200-H may be enhanced. On the other hand, this is illustratively shown, and in the electronic panel 200-H according to an exemplary embodiment of the present inventive concept, the groove parts GV1, GV2, and GV3 may be provided singly or omitted, and are not limited to any one exemplary embodiment. Alternatively, more than three groove parts may be provided.

The dam part DMP is disposed in the wire area LA to divide the formation area of the organic layer 62 into a predetermined area and prevents further expansion. For example, the dam part DMP may prevent the organic layer 62 from flowing out from the active area AA toward the panel hole MH. The dam part DMP may be provided in plurality and disposed between the groove parts GV1, GV2, and GV3. The dam part DMP is shown as a laminated structure including the first to third layers P11, P12, and P13. However, this is illustratively shown, and the dam part DMP may have a single-layer structure, a double-layer structure, or a four or more layer structure and is not limited to any one exemplary embodiment.

In the electronic panel 200-H according to the present inventive concept, the planarization layer FL_H may be disposed in the hole area HA. The planarization layer FL_H covers a non-flat surface defined by the dam part DMP or the groove parts GV1, GV2, and GV3 disposed in the wire area LA to provide a flat surface FL_SH on the upper part. The flat surface FL_SH of the planarization layer FL_H may define a plane substantially identical to the flat surface 60_S of the sixth insulating layer 60. For example, the encapsulation layer (the sixth insulating layer 60) may include the non-flat surface overlapping the hole area HA, and the planarization layer FL_H may be disposed on the non-flat surface overlapping the hole area HA to provide a flat surface FL_SH.

The detection pattern SP_H and the detection lines TSL_H may be disposed on the flat surface 60_S of the sixth insulating layer 60 and the flat surface FL_SH of the planarization layer FL_H. The detection lines TSL_H may be a pattern through the hole area HA in the first connection pattern BP1 (see FIG. 7C) or the second connection pattern BP2 (see FIG. 7C). For example, at least some of the detection patterns SP1 and SP2 and the connection patterns BP1 and BP2 may be disposed on the planarization layer FL_H to overlap the non-flat surface overlapping the hole area HA in a plan view. According to the present inventive concept, by further including the planarization layer FL_H, the area where the detection lines TSL_H may be disposed may extend to the hole area HA where the dam parts DMP or the groove parts GV1, GV2, and GV3 are formed. Thus, the process reliability of the input sensing unit 220-H disposed on the display unit 210-H may be enhanced and the electrical reliability may be enhanced.

The electronic panel 200-H according to the present inventive concept may further include a metal pattern MTL disposed in the hole area HA. The metal pattern MTL may be disposed along the edge of the panel hole MH and cover at least a part of the planarization layer FL_H. The metal pattern MTL may be spaced apart from the detection lines TSL_H. Thus, an electrical short between the metal pattern MTL and the detection lines TSL_H may be prevented.

The metal pattern MTL may prevent the planarization layer FL_H from being damaged by laser or the like when forming the panel hole MH. Further, as the detection lines TSL_H are spaced apart from the metal pattern MTL, it is possible to prevent the detection lines TSL_H from being damaged by a laser or the like.

According to the present inventive concept, the input sensing unit 220-H may be disposed in the hole area HA having a non-flat surface, thereby enhancing the design freedom of the input sensing unit 220-H. Further, according to the present inventive concept, even if the panel hole MH is formed, the area where the detection lines TSL_H are disposed may be stably secured, so that a reduction in the reliability of the input sensing unit 220-H may be prevented.

According to the present inventive concept, since the input sensing unit may be disposed on a non-flat surface, an area where the input sensing unit is disposed on the display unit may be secured. Accordingly, the electronic panel with enhanced integration of the input sensing unit and enhanced reliability may be stably provided.

Although the exemplary embodiments of the present inventive concept have been described, it is understood that the present inventive concept should not be limited to these exemplary embodiments but various changes and modifications may be made therein by one ordinary skilled in the art without departing from the spirit and scope of the present inventive concept as defined in the appended claims.

What is claimed is:

1. An electronic panel comprising:
a display unit including a base substrate, a plurality of pixels on the base substrate, an encapsulation layer covering the pixels, a planarization layer disposed on the encapsulation layer, and a crack dam disposed on at least of an edge of the base substrate, the display unit in a plan view including an active area displaying an image and a peripheral area adjacent to the active area; and
an input sensing unit disposed on the display unit and configured to detect an external input,
wherein an upper surface of the encapsulation layer comprises:
a flat surface provided in the active area; and
a non-flat surface provided in the peripheral area and curved compared to the flat surface,
wherein the crack dam overlaps the peripheral area and is covered by the encapsulation layer,
the planarization layer covers the non-flat surface, and
the input sensing unit is disposed on the flat surface and on the non-flat surface.

2. The electronic panel of claim 1, wherein an upper surface of the planarization layer is parallel to the flat surface.

3. The electronic panel of claim 2, wherein at least a part of the planarization layer covers the flat surface.

4. The electronic panel of claim 3, wherein the planarization layer covers the flat surface entirely.

5. The electronic panel of claim 1, wherein an upper surface of the planarization layer defines a plane substantially the same as that of the flat surface.

6. The electronic panel of claim 1, wherein the encapsulation layer comprises a first inorganic layer, a second inorganic layer disposed on the first inorganic layer, and an organic layer disposed between the first inorganic layer and the second inorganic layer,
wherein the non-flat surface non-overlaps the organic layer in the plan view.

7. The electronic panel of claim 6, wherein the display unit further comprises a dam part disposed in the peripheral area and non-overlapping the organic layer in the plan view,
wherein the planarization layer is disposed overlapping the dam part in the plan view.

8. The electronic panel of claim 1, wherein the input sensing unit comprises a plurality of sensing electrodes disposed in the active area and a plurality of detection lines connected to the sensing electrodes,
wherein the detection lines are disposed on the planarization layer and are disposed overlapping the non-flat surface in a plan view.

9. An electronic device comprising:
an electronic panel configured to display an image and detect an external input; and
an electronic module overlapping the electronic panel in a plan view,
wherein the electronic panel comprises:
a base substrate including an active area, and a peripheral area adjacent to the active area;
a plurality of pixels disposed on the base substrate and configured to display the image in the active area;
an encapsulation layer including an upper surface that includes a flat surface defined in the active area and overlapping the pixels in the plan view and a first non-flat surface defined in the peripheral area and curved compared to the flat surface;

a crack dam disposed on at least of an edge of the base substrate, and overlapping the peripheral area and covered by the encapsulation layer;

a planarization layer disposed on the first non-flat surface; and an input sensing unit disposed on the encapsulation layer and the planarization layer, and including a plurality of sensing electrodes and a plurality of detection lines connected to the sensing electrodes.

10. The electronic device of claim 9, wherein a hole area is defined in an area overlapping the electronic module in the active area, wherein at least some of the pixels are removed in the hole area.

11. The electronic device of claim 10, wherein at least some of the sensing electrodes are removed from the hole area.

12. The electronic device of claim 10, wherein the encapsulation layer further comprises a second non-flat surface overlapping the hole area, wherein the electronic panel further comprises a hole planarization layer disposed on the second non-flat surface overlapping the hole area.

13. The electronic device of claim 12, wherein each of the sensing electrodes comprises a plurality of detection patterns and a plurality of connection patterns each disposed between the detection patterns and connecting two adjacent ones of the detection patterns, wherein at least some of the detection patterns and the connection patterns are disposed on the hole planarization layer to overlap the second non-flat surface overlapping the hole area in the plan view.

14. The electronic device of claim 13, wherein the electronic panel further comprises a panel hole defined in the hole area and passing through the electronic panel, wherein the electronic module is disposed overlapping the panel hole.

15. The electronic device of claim 14, wherein a connection pattern disposed in the hole area among the connection patterns extends along an edge of the panel hole.

16. The electronic device of claim 9, wherein the electronic panel further comprises a dam part disposed in the peripheral area, wherein the planarization layer overlaps the dam part in the plan view.

17. The electronic device of claim 16, wherein some of the detection lines are disposed on the planarization layer to overlap the dam part in the plan view.

18. The electronic device of claim 9, wherein the planarization layer covers at least a portion of the flat surface.

19. The electronic device of claim 18, wherein the planarization layer is disposed on the flat surface to overlap the active area.

20. The electronic device of claim 9, wherein an upper surface of the planarization layer defines a plane substantially the same as that of the flat surface.

21. The electronic device of claim 9, wherein an upper surface of the planarization layer defines a plane parallel to the flat surface.

22. An electronic panel comprising:

a display unit comprising an active area displaying an image and a peripheral area adjacent to the active area;

an encapsulation layer formed in the display unit, and comprising a first flat surface provided in the active area and extending to a portion of the peripheral area, and a non-flat surface provided in the peripheral area;

a planarization layer disposed on the non-flat surface of the encapsulation layer and providing a second flat surface; and an input sensing unit disposed on the first flat surface and the second flat surface, and configured to detect an external input, wherein the input sensing unit comprises:

a plurality of sensing electrodes disposed in the active area;

a plurality of detection lines disposed on the second flat surface, connected to the sensing electrodes, and overlapping the non-flat surface of the encapsulation layer in a plan view; and a detection insulating layer covering the first flat surface and the second flat surface, with an uppermost surface of the detection insulating layer lower than top surfaces of the detection lines.

* * * * *